(12) United States Patent
Liu et al.

(10) Patent No.: US 12,287,242 B2
(45) Date of Patent: Apr. 29, 2025

(54) READOUT CIRCUIT OF INFRARED FOCAL PLANE ARRAY AND CONTROL METHOD THEREFOR

(71) Applicant: HANGZHOU HIKMICRO SENSING TECHNOLOGY CO., LTD., Hangzhou (CN)

(72) Inventors: Jun Liu, Hangzhou (CN); Jia He, Hangzhou (CN); Mengdi Song, Hangzhou (CN)

(73) Assignee: HANGZHOU HIKMICRO SENSING TECHNOLOGY CO., LTD. (CN)

( * ) Notice: Subject to any disclaimer, the term of this patent is extended or adjusted under 35 U.S.C. 154(b) by 0 days.

(21) Appl. No.: 18/853,247
(22) PCT Filed: Mar. 30, 2023
(86) PCT No.: PCT/CN2023/084996
§ 371 (c)(1),
(2) Date: Oct. 1, 2024
(87) PCT Pub. No.: WO2023/185990
PCT Pub. Date: Oct. 5, 2023

(65) Prior Publication Data
US 2025/0102365 A1    Mar. 27, 2025

(30) Foreign Application Priority Data
Apr. 2, 2022 (CN) .................. 202210340408.8

(51) Int. Cl.
*G01J 5/24* (2006.01)
*G01J 5/0804* (2022.01)
(Continued)

(52) U.S. Cl.
CPC ............. *G01J 5/24* (2013.01); *G01J 5/0804* (2022.01); *G01R 19/10* (2013.01); *G01R 19/16576* (2013.01); *G01J 2005/202* (2013.01)

(58) Field of Classification Search
CPC ...... G01J 5/24; G01J 5/0804; G01J 2005/202; G01R 19/10; G01R 19/16576
See application file for complete search history.

(56) References Cited

U.S. PATENT DOCUMENTS

| | | |
|---|---|---|
| 5,811,808 A | 9/1998 | Cannata et al. |
| 2014/0231651 A1 | 8/2014 | Kim et al. |
| 2020/0068145 A1 | 2/2020 | Lacroix et al. |

FOREIGN PATENT DOCUMENTS

| | | |
|---|---|---|
| CN | 102494784 | 6/2012 |
| CN | 102735344 | 10/2012 |

(Continued)

OTHER PUBLICATIONS

Perenzoni et al. ("A 160×120-pixel Uncooled IR-FPA Readout Integrated Circuit with On-chip Non-uniformity Compensation," 2010 Proceedings of ESSCIRC, Seville, Spain, 2010, pp. 122-125) (Year: 2010).*

(Continued)

*Primary Examiner* — David P Porta
*Assistant Examiner* — Meenakshi S Sahu
(74) *Attorney, Agent, or Firm* — Fish & Richardson P.C.

(57) ABSTRACT

A readout circuit of infrared focal plane array (FPA) and a control method therefor. The readout circuit is connected to an infrared FPA, which comprises a plurality of pixels. The readout circuit comprises an integral and readout unit, a correction unit and a digital control unit. For each pixel, the correction unit determines an initial bias value based on a to-be-corrected parameter value for the pixel; the integral and readout unit determines, based on a first current corresponding to the initial bias value and a second current caused a pixel response temperature value, a responsive voltage value for the pixel; and the digital control unit adjusts, based on a comparison result between the responsive voltage value and a preset voltage value, the to-be-corrected parameter value for the pixel, to obtain an adjusted parameter value, and determines, based on the adjusted parameter value, an optimal corrected parameter value for the pixel.

20 Claims, 4 Drawing Sheets

(51) Int. Cl.
*G01J 5/20* (2006.01)
*G01R 19/10* (2006.01)
*G01R 19/165* (2006.01)

(56) References Cited

FOREIGN PATENT DOCUMENTS

| | | |
|---|---|---|
| CN | 102809436 | 12/2012 |
| CN | 104266767 | 1/2015 |
| CN | 104677501 | 6/2015 |
| CN | 109974866 | 7/2019 |
| CN | 110375863 | 10/2019 |
| CN | 110731079 | 1/2020 |
| CN | 111246138 | 6/2020 |
| CN | 111447382 | 7/2020 |
| CN | 111623891 | 9/2020 |
| CN | 111829670 | 10/2020 |
| CN | 111982311 | 11/2020 |
| CN | 114427914 | 5/2022 |
| WO | WO 2015093826 | 6/2015 |

OTHER PUBLICATIONS

International Search Report in International Appln. No. PCT/CN2023/084996, mailed on May 23, 2023, 8 pages (with English translation).
Office Action in Chinese Appln. No. 202210340408.8, mailed on May 16, 2022, 10 pages (with Machine/Partial English Translation).
Notice of Allowance in Chinese Appln. No. 202210340408.8, mailed on May 27, 2022, 6 pages (with Machine/Partial English Translation).

\* cited by examiner

READOUT CIRCUIT OF INFRARED FOCAL PLANE ARRAY AND CONTROL METHOD THEREFOR

CROSS-REFERENCE TO RELATED APPLICATION

The present application is a U.S. National Stage of International Application No. PCT/CN2023/084996, filed on Mar. 30, 2023, which claims the benefit of priority to Chinese Application No. 202210340408.8, filed on Apr. 2, 2022, the contents of all of which are incorporated by reference herein in their entireties for all purposes.

TECHNICAL FIELD

The present disclosure relates to the field of infrared temperature measurement technologies, and in particular to a readout circuit of an infrared focal plane array and a control method therefor.

BACKGROUND

Thermal imaging temperature measurement is a non-contact temperature measurement method, which can acquire a temperature value of a target object in a target scene. For example, an infrared focal plane array (FPA) may include a plurality of pixels, and each pixel may be a thermistor, also known as a sensor unit. For each pixel, after an infrared radiation of the target scene reaches the pixel, the pixel can sense an external environment temperature, thus changing a resistance value of the pixel and affecting a current value passing through the pixel. Based on this current value, a responsive voltage value corresponding to the pixel can be determined, and a temperature value corresponding to the pixel can be determined based on this responsive voltage value.

During thermal imaging temperature measurement, a mapping relationship between voltage values and temperature values (i.e., functional relationship) needs to be calibrated in advance. In this way, the mapping relationship is queried based on the responsive voltage value for each pixel, and the temperature value for the pixel can be obtained. The obtained temperature value corresponding to each pixel of the target object is the temperature value corresponding to the target object in the target scene.

Due to deviations in the manufacturing process, responses of different pixels to the same infrared radiation may be different. When the same infrared radiation reaches pixel 1 and pixel 2, if a responsive voltage value output for pixel 1 is different from a responsive voltage value output for pixel 2, it will cause the non-uniformity of imaging. This difference in pixels needs to be corrected. This correction method is named as non-uniformity correction, and it is mainly realized by an external processor, and the correction effect is poor.

SUMMARY

The present disclosure provides a readout circuit of an infrared FPA, including an integral and readout unit of a focal plane, a correction unit and a digital control unit, where the integral and readout unit is connected with the infrared FPA which includes a plurality of pixels. For each pixel in the infrared FPA, the correction unit is configured to determine an initial bias value based on a to-be-corrected parameter value for the pixel and transfer the initial bias value to the integral and readout unit; the integral and readout unit is configured to determine a responsive voltage value for the pixel based on a first current corresponding to the initial bias value and a second current caused by the pixel in response to a temperature value; and the digital control unit is configured to obtain an adjusted parameter value by adjusting the to-be-corrected parameter value based on a comparison result of the responsive voltage value and a preset voltage value and determine an optimal correction parameter value for the pixel based on the adjusted parameter value.

The present disclosure provides a control method of a readout circuit of an infrared FPA, where the readout circuit is connected with the infrared FPA including a plurality of pixels, and the method includes: in response to that the readout circuit is powered on, controlling, by the readout circuit, a shutter to open, so that respective pixels in the infrared FPA sense a temperature value of the shutter; during the respective pixels in the infrared FPA sense the temperature value of the shutter, determining, by the readout circuit, an optimal correction parameter value for each of the respective pixels in the infrared FPA; in response to that the optimal correction parameter value for each of the respective pixels is determined, controlling, by the readout circuit, the shutter to close, so that the respective pixels in the infrared FPA sense an actual target temperature value of a target scene; and when the respective pixels in the infrared FPA sense the actual target temperature value, determining, by the readout circuit, a responsive voltage value for each of the respective pixels based on the optimal correction parameter value for the pixel, and outputting the responsive voltage value for each of the respective pixels in the infrared FPA.

As can be seen from the above technical solutions, in the embodiments of the present disclosure, a readout circuit of infrared FPA is designed, which can automatically correct the non-uniformity on chip, without the need for an external processor to realize the non-uniformity correction, or reduce the complexity of the non-uniformity correction by the external processor, thus reducing the overhead of external hardware resources, reducing the cost, being simple to develop and having good correction effect.

BRIEF DESCRIPTION OF DRAWINGS

In order to more clearly illustrate the technical solutions in the embodiments of the present disclosure or the related art, the following will briefly introduce the accompanying drawings required in the embodiments of the present disclosure or the description of the related art. The accompanying drawings in the following description are only some of the embodiments documented in the present disclosure. For those skilled in the art, other accompanying drawings can be obtained according to these accompanying drawings of embodiments of the present disclosure.

DETAILED DESCRIPTION

Figure 1:
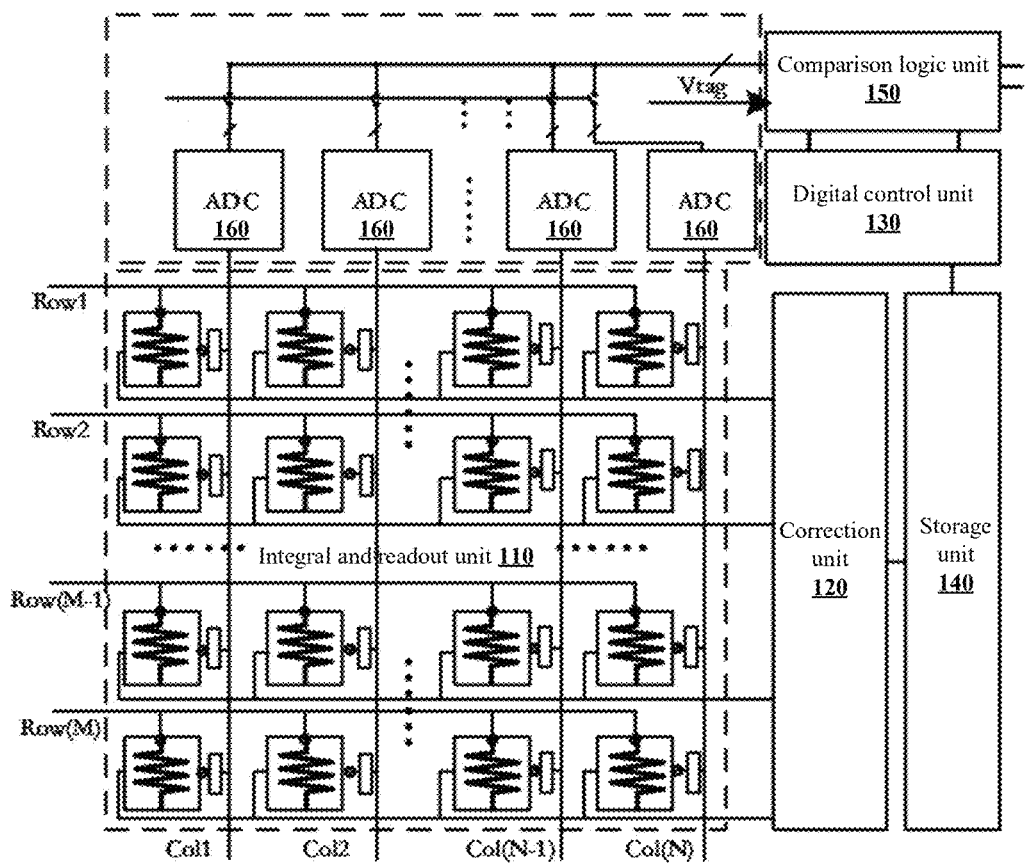
FIG. 1 is a schematic structural diagram of a readout circuit of infrared FPA according to an embodiment of the present disclosure.

Terms used in embodiments of the present disclosure are only for a purpose of describing specific embodiments, and are not limiting the present disclosure. Singular forms of "a", "said", and "the" used in the present disclosure and in the claims are also intended to include majority forms, unless the context clearly indicates otherwise. It should also be understood that the term "and/or" as used herein refers to any or all of the possible combinations containing one or more of the listed items in association.

It should be understood that although terms first, second, third, etc. may be used to describe various information in the embodiments of the present disclosure, these information should not be limited to these terms. These terms are used only to distinguish the same type of information from one another. For example, without departing from the scope of the present disclosure, first information can also be called second information, and similarly, the second information can also be called the first information. Depending on the context, in addition, the word "if" used can be interpreted as "at" or "when" or "in response to determining".

A thermal imaging device (e.g., a camera, a video camera, etc. which adopts thermal imaging to realize temperature measurement, including an infrared thermal imaging camera, etc.) may include an infrared FPA (also named as a FPA, which is a circuit composed of a large number of pixels), a shutter and a processor (hereinafter also named as an external processor to indicate that the processor can be located outside the infrared FPA and shutter), etc.

The infrared FPA may include a plurality of pixels, and each pixel may be a thermistor. For each pixel, after an infrared radiation of a target scene reaches the pixel, the pixel can sense an external environment temperature, thus changing a resistance value of the pixel and affecting a current value passing through the pixel as well as a responsive voltage value corresponding to the pixel. The responsive voltage value corresponding to each pixel can be output to an external processor. Based on a pre-calibrated mapping relationship between voltage values and temperature values, the external processor can query the mapping relationship after obtaining the responsive voltage value for each pixel, and obtain the temperature value for each pixel. The temperature values corresponding to these pixels of the target object are also actual target temperature values of the target scene.

A shutter is a device for shielding lens of a thermal imaging device. When the shutter is open, i.e., with the shutter blocking the lens of the thermal imaging device, a temperature value perceived by each pixel in the infrared FPA is the temperature value of the shutter, and temperature values perceived by different pixels are the same. When the shutter is closed, i.e., when the shutter is not blocking the lens of the thermal imaging device, the temperature value perceived by each pixel in the infrared FPA is an external target temperature value (i.e., a temperature value of a to-be-detected target object), and the temperature values perceived by different pixels may be different.

Due to deviations in the manufacturing process, different pixels may have different responses to the same infrared radiation, resulting in non-uniformity of imaging. Generally speaking, it is necessary to correct this difference of pixels before imaging, which can also be named as non-uniformity correction. In related technologies, non-uniformity correction is mainly achieved by external processors, which have poor correction effects and require the use of external processor resources, wasting processing resources.

In order to solve the above problems, a readout circuit (also named as readout integrated circuit, ROIC) of infrared FPA is proposed in an embodiment of the present disclosure. The readout circuit is connected with the infrared FPA and configured to correct temperature values sensed by respective pixels in the infrared FPA, that is, the non-uniformity correction is realized by the ROIC. In this way, it is not necessary to realize non-uniformity correction by an external processor, which reduces the overhead of external hardware resources, reduces the cost, is simple to develop and has good correction effect. For example, the thermal imaging device can further include a readout circuit of infrared FPA, which can perform non-uniformity correction on the responsive voltage value corresponding to the pixel and output a corrected responsive voltage value to an external processor. In this way, the external processor no longer needs to perform non-uniformity correction on the responsive voltage value of the pixel, but can directly determine a temperature value based on the received responsive voltage value.

In the following, the structure and function of the readout circuit of infrared FPA according to this embodiment will be described in combination with specific embodiments.

Referring to FIG. 1, a schematic diagram of a structure of a readout circuit of infrared FPA may include, but is not limited to, an integral and readout unit of a focal plane (also named as integral and readout circuit) 110, a correction unit 120, a digital control unit 130, a storage unit 140, a comparison logic unit 150, and an ADC (analog to digital converter) 160. The readout circuit can be connected with an infrared FPA, which can include a large number of pixels. In FIG. 1, M*N pixels are taken as an example, that is, there are N pixels in each row, and there are M rows of pixels in total. The number of ADCs 160 can be N, i.e., all pixels in each column correspond to the same ADC 160.

As shown in FIG. 1, M pixels in each column correspond to the same ADC 160, i.e., the ADC 160 performs analog-to-digital conversion on responsive voltage values of the M pixels in the column, and the specific process is shown in the subsequent embodiments. All pixels (i.e., M*N pixels) correspond to the same correction unit 120, that is, one correction unit provides bias values for M*N pixels, and the specific process is shown in the subsequent embodiments. All the pixels correspond to the same digital control unit 130, that is, one digital control unit 130 determines optimal correction parameter values corresponding to M*N pixels, and the specific process is shown in the subsequent embodiments. All the pixels correspond to the same storage unit 140, that is, one storage unit 140 stores to-be-corrected parameter values or optimal correction parameter values corresponding to M*N pixels, and the specific process is shown in the subsequent embodiments. All the pixels correspond to the same comparison logic unit 150, that is, one comparison logic unit 150 completes comparison operations of M*N pixels (i.e., comparing a responsive voltage value with a preset voltage value), and the specific process is shown in the subsequent embodiments.

For each pixel in the infrared FPA, because each pixel is processed in the same way, for the convenience of description, in the following embodiments, the processing process of one pixel is illustrated as an example.

Figure 2:
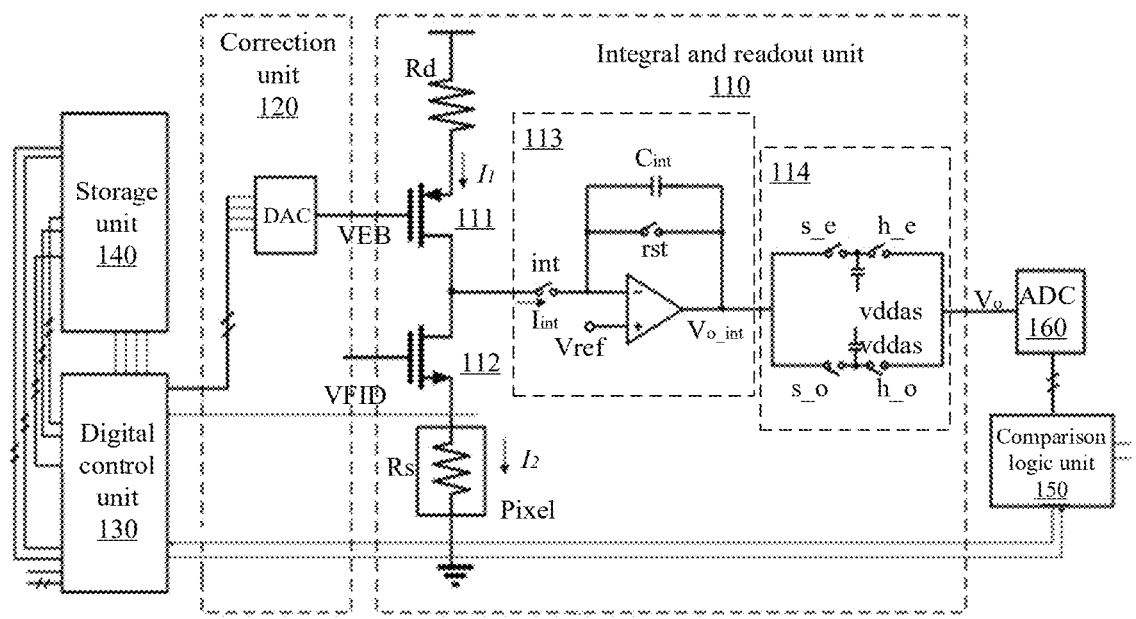
FIG. 2 is a schematic structural diagram of a readout circuit of infrared FPA according to an embodiment of the present disclosure.

Referring to FIG. 2, a schematic diagram of a structure of a readout circuit of infrared FPA may include, but is not limited to, an integral and readout unit 110, a correction unit 120, a digital control unit 130, a storage unit 140, a comparison logic unit 150, and an ADC 160. The integral and readout unit 110 is connected with an infrared FPA, and the infrared FPA may include a large number of pixels (e.g., M*N pixels). For convenience of description, a pixel is taken as an example in FIG. 2.

For example, the infrared FPA may be a uncooled infrared FPA, which is an array composed of infrared sensitive pixels (referred to as pixels for short in the present disclosure). The infrared sensitive pixel can absorb external infrared radiation and cause the pixel to heat up, which causes a change in a resistance value of a heat-sensitive material. And this array can work in a non-absolute zero environment.

For example, the readout circuit is a readout circuit of uncooled infrared focal plane array that integrates an on-chip non-uniformity automatic correction function, and can automatically correct the non-uniformity of pixels on the chip without off-chip operation.

The readout circuit supports two working states: a correction state (also named as an automatic correction state) and a readout state (also named as a normal readout state). After the readout circuit is powered on and reset, it will first enter the correction state. In the correction state, it is necessary to an obtain optimal correction parameter value corresponding to each pixel, and write optimal correction parameter values into the storage unit 140. After the correction state is finished, the readout state is entered. In the readout state, a responsive voltage value of a pixel can be corrected by using an optimal correction parameter value in the storage unit 140, and the corrected responsive voltage value can be output, that is, the correction can be completed in the readout circuit.

The functions of the integral and readout unit 110, the correction unit 120, the digital control unit 130, the storage unit 140, the comparison logic unit 150, the ADC 160 and other devices shown in FIG. 2 are described below.

The integral and readout unit 110 is configured to determine a responsive voltage value for the pixel based on a first current corresponding to an initial bias value and a second current caused by the pixel in response to a temperature value. The second current caused by the pixel in response to the temperature value refers to changing a resistance value of the pixel when a temperature value of a test target sensed by the pixel changes, and the second current corresponding to the pixel changes when the resistance value of the pixel changes. That is, the second current is related to the test target temperature value sensed by the pixel.

Referring to FIG. 2, the integral and readout unit 110 may include a resistor Rd, a first metal oxide semiconductor field effect transistor (MOSFET, or MOS transistor for short) 111, a second MOS transistor 112, an integration circuit 113, and a sample-and-hold circuit 114. It should be noted that in FIG. 2, although a pixel Rs is placed inside the integral and readout unit 110, it is only for convenience to explain a connection relationship between the pixel Rs and the integral and readout unit 110, and the pixel Rs does not belong to a device of the integral and readout unit 110.

The integration circuit 113 can be composed of an operational amplifier, a switch rst and an integration capacitor Cint.

The sample-and-hold circuit 114 is also named as a sample-and-hold amplifier. When the ADC 160 performs analog-to-digital conversion on an analog signal, a certain conversion time is required, during which the analog signal should remain essentially unchanged, so that the conversion accuracy can be guaranteed. The sample-and-hold circuit 114 is a circuit to realize this function.

Referring to FIG. 2, an input voltage of the first MOS transistor 111 is a bias value VEB. In the correction state, this bias value VEB is named as an initial bias value VEB, which is a bias value determined by the correction unit 120 based on a to-be-corrected parameter value. In the readout state, this bias value VEB is named as a target bias value VEB, which is a bias value determined by the correction unit 120 based on an optimal correction parameter value.

In the correction state, when the initial bias value VEB is larger, a current I1 passing through the first MOS transistor 111 (denoted as a first current I1) is larger, i.e., the initial bias value VEB is positively correlated with the first current I1. Obviously, by controlling a magnitude of the initial bias value VEB, a magnitude of the first current I1 can be adjusted. Similarly, in the readout state, when the target bias value VEB is larger, the current I1 passing through the first MOS transistor 111 (denoted as a third current I1) is larger, i.e., the target bias value VEB is positively correlated with the third current I1. For the convenience of description, in subsequent embodiments, the processing process of the correction state is taken as an example, i.e., the input voltage of the first MOS transistor 111 is the initial bias value VEB, and the current passing through the first MOS transistor 111 is the first current I1, i.e., the initial bias value VEB corresponds to the first current I1.

Referring to FIG. 2, an input voltage of the second MOS transistor 112 is a voltage value VFID, the voltage value VFID is a fixed voltage value, and the working principle of this second MOS transistor 112 will not be repeated in this embodiment.

Referring to FIG. 2, the pixel Rs is a resistive element in the infrared FPA, which can be a microelectro mechanical systems (MEMS) thermistor. In the present disclosure, there is no limitation on a specific type of pixel Rs. In practical application, the number of pixels Rs can be multiple, and one pixel Rs is taken as an example in FIG. 2. The pixel Rs is configured to convert an infrared signal into an electrical signal. In other words, after an infrared thermal radiation of the target scene reaches the pixel Rs, the pixel Rs is able to sense an external ambient temperature, which changes a resistance value of the pixel Rs and affects a value of a current, i.e., a current I2, passing through the pixel Rs.

In the correction state, the shutter can be opened for the infrared FPA, and a temperature value of each position on the shutter is the same. In this way, the external ambient temperature sensed by the pixel Rs is the temperature value of the shutter. For the convenience of distinguishing, the temperature value sensed by the pixel Rs is recorded as a test target temperature value, that is, the test target temperature value is the temperature value of the shutter. Obviously, the test target temperature value sensed by the pixel Rs will affect the current I2 passing through the pixel Rs (denoted as a second current I2), that is, the second current I2 matches the test target temperature value sensed by the pixel Rs. In the readout state, the shutter can be closed for the infrared FPA. In this way, the external ambient temperature sensed by the pixel Rs is an actual target temperature value of the target scene. Obviously, the actual target temperature value sensed by the pixel Rs can affect the current I2 passing through the pixel Rs (denoted as a fourth current I2), that is, the fourth current I2 matches the actual target temperature value of the target scene sensed by the pixel Rs.

For convenience of description, in subsequent embodiments, the processing process of the correction state is taken as an example, that is, the current I2 of the pixel Rs is the second current I2, and the second current I2 matches the test target temperature value sensed by the pixel Rs.

Referring to FIG. 2, the integration circuit 113 may be connected with the first MOS transistor 111, the pixel Rs, and the sample-and-hold circuit 114. An input current Iint of the integration circuit 113 may also be referred to as an integration current Iint, and the input current Iint may be determined based on the first current I1 and the second current I2. That is, the first current I1 corresponding to the initial bias value VEB and the second current I2 of the pixel Rs can be determined, and then the input current Iint corresponding to the integration circuit 113 can be determined based on the first current I1 and the second current I2. For example, the input current Iint can be determined as follows:

$$Iint = I1 - I2.$$

On the basis of knowing the input current Iint, the input current Iint can be integrated by the integration circuit 113 (there is no restriction on the integration process), and a voltage input value Vo_int corresponding to the pixel Rs can be obtained. For example, the integration circuit 113 can determine the voltage input value Vo_int in the following way:

$$Vo\_int = Vref - Iint * Tint / Cint.$$

In the above formula, Vref is an input voltage of an operational amplifier, Iint is an input current, Tint is an opening time of a switch int, i.e., the integration time, and Cint is an integration capacitor.

Referring to FIG. 2, an input of the sample-and-hold circuit 114 is the voltage input value Vo_int, an output of the sample-and-hold circuit 114 is a responsive voltage value Vo, and a responsive voltage value Vo for the pixel Rs can be obtained by performing a sample-and-hold operation on the voltage input value Vo_int by the sample-and-hold circuit 114, i.e., Vo=Vo_int.

When the ADC 160 performs analog-to-digital conversion on an analog signal, a certain conversion time is required. During this conversion time, the analog signal should remain essentially unchanged, so that the conversion accuracy can be guaranteed. The sample-and-hold circuit 114 is a circuit to realize this function, and a working process of this sample-and-hold circuit 114 is not limited in this embodiment.

To sum up, for the pixel Rs, an input voltage of the first MOS transistor 111 is the initial bias value VEB, a current passing through the first MOS transistor 111 is the first current I1 corresponding to the initial bias value VEB, and the second current I2 is caused by the pixel Rs in response to the temperature value. A sum of the first current I1 and the second current I2 can be determined as the input current Iint of the integration circuit 113, so that the input current Iint can be integrated by the integration circuit to obtain the voltage input value Vo_int corresponding to the pixel Rs. Then, the responsive voltage value Vo corresponding to the pixel Rs is determined based on the voltage input value Vo_int corresponding to the pixel Rs. For example, the voltage input value Vo_int corresponding to the pixel Rs is input to the sample-and-hold circuit, so that the voltage input value Vo_int is sampled and held by the sample-and-hold circuit to obtain the responsive voltage value Vo corresponding to the pixel Rs.

After obtaining the responsive voltage value Vo corresponding to the pixel Rs, the integral and readout unit can further input the responsive voltage value Vo to the ADC 160 for processing by the ADC 160 based on the responsive voltage value Vo.

The ADC is configured to acquire the responsive voltage value from the integral and readout unit, perform analog-to-digital conversion on the responsive voltage value to obtain a responsive voltage value in digital-signal, and output the responsive voltage value in digital-signal to the comparison logic unit.

Referring to FIG. 2, the integral and readout unit 110 may input a responsive voltage value Vo in analog-signal to the ADC 160, which performs an analog-to-digital conversion on the responsive voltage value Vo in analog-signal to obtain the responsive voltage value Vo in digital-signal, and outputs the responsive voltage value Vo in digital-signal to the comparison logic unit 150.

For example, it can be agreed that the responsive voltage value Vo in digital-signal is a K-bit binary value. In this case, the to-be-corrected parameter value is a K-bit binary value, and a preset voltage value is also a K-bit binary value. In the present disclosure, there is no restriction on the value of this K. For example, K may be 4, 8, etc., and 4 is subsequently used as an example for illustration.

On this basis, when the ADC 160 converts the responsive voltage value Vo in analog-signal into the responsive voltage value Vo in digital-signal corresponding to the pixel Rs, the responsive voltage value Vo is a K-bit binary value (that is, a K-bit code value).

The comparison logic unit is configured to determine a logic value based on a responsive voltage value and a configured preset voltage value, and to output the logic value to the digital control unit. If the responsive voltage value is less than the preset voltage value, the logic value can be determined as a first value (such as 1). Or, if the responsive voltage value is greater than the preset voltage value, the logic value can be determined as a second value (such as 0).

Referring to FIG. 2, the comparison logic unit 150 may acquire a preset voltage value Vtag. For example, the digital control unit 130 may acquire the preset voltage value Vtag and send the preset voltage value Vtag to the comparison logic unit. The preset voltage value Vtag can be a preset voltage value Vtag of digital signal, such as a K-bit binary value, and the preset voltage value Vtag may also be named as a correction target value Vtag, for which the value of the preset voltage value Vtag is not restricted and may be configured empirically. On this basis, the comparison logic unit 150 can compare the responsive voltage value Vo with the preset voltage value Vtag after obtaining the responsive voltage value Vo in digital-signal corresponding to the pixel Rs.

If the responsive voltage value Vo is less than the preset voltage value Vtag (i.e., Vo<Vtag), the comparison logic unit 150 determines that the logic value is of a first value and outputs the logic value (i.e., the first value) corresponding to the pixel Rs to the digital control unit 130. If the responsive voltage value Vo is greater than the preset voltage value Vtag (i.e., Vo>Vtag), the comparison logic unit 150 determines that the logic value is of a second value and outputs the logic value (i.e., the second value) corresponding to the pixel Rs to the digital control unit 130. In this embodiment, the first value and the second value are not limited. For convenience of description, in the following embodiments, the first value is 1 and the second value is 0 as an example.

For example, in the correction state, the digital control unit 130 can enable the comparison logic, that is, issue an enable command to the comparison logic unit 150, so that the comparison logic unit 150 executes a comparison logic, i.e., compares the responsive voltage value Vo with the preset voltage Vtag. For example, when Vo<Vtag, the comparison logic unit 150 outputs 1 to the digital control unit 130, otherwise, the comparison logic unit 150 outputs 0 to the digital control unit 130.

In the readout state, the digital control unit 130 may turn off the comparison logic, i.e., send a disable command to the comparison logic unit 150, causing the comparison logic unit 150 to turn off the comparison logic. After the comparison logic is turned off, the comparison logic unit 150 no longer compares the responsive voltage value Vo with the preset voltage value Vtag, and no longer outputs a logic value.

In the readout state, the comparison logic unit 150 directly performs a parallel-to-serial operation on the responsive voltage value Vo output by the ADC 160, and sequentially outputs the responsive voltage values Vo for respective pixels according to a time sequence, i.e., provides the responsive voltage values Vo for respective pixels in the infrared FPA to an external processor, the process will not be described in detail.

The digital control unit 130 is configured to obtain an adjusted parameter value by adjusting the to-be-corrected parameter value based on a comparison result of the responsive voltage value and a preset voltage value, determine an optimal correction parameter value for the pixel based on the adjusted parameter value, and write the optimal correction parameter value into the storage unit 140, i.e., replace the to-be-corrected parameter value for the pixel in the storage unit 140.

For example, in the process of adjusting the to-be-corrected parameter value based on the comparison result between the responsive voltage value and the preset voltage value, if the responsive voltage value is less than the preset voltage value, the to-be-corrected parameter value is increased. Or, if the responsive voltage value is greater than the preset voltage value, the to-be-corrected parameter value is reduced.

For example, in the process of determining the optimal correction parameter value for the pixel based on the adjusted parameter value, if a number of adjusting the to-be-corrected parameter value has reached a target number of adjusting, taking the adjusted parameter value as the optimal correction parameter value for the pixel. If the number of adjusting the to-be-corrected parameter value does not reach the target number of adjusting, taking the adjusted parameter value as the to-be-corrected parameter value for the pixel, and writing the to-be-corrected parameter value into the storage unit 140 to re-determine the responsive voltage value for the pixel based on the to-be-corrected parameter value.

In a possible embodiment, the responsive voltage value may be output to the digital control unit (i.e., the responsive voltage value is provided directly to the digital control unit without involving the comparison logic unit and without involving the comparison logic of the comparison logic unit), and the digital control unit may be preconfigured with the preset voltage value described above. In this case, the digital control unit can obtain the responsive voltage value and the preset voltage value, determine the comparison result of the responsive voltage value and the preset voltage value, and then adjust the to-be-corrected parameter value based on the comparison result.

In another possible embodiment, the logic value may be output to the digital control unit (i.e., the comparison logic unit is involved, and the comparison logic unit executes the comparison logic and provides the comparison result (i.e., the logic value) to the digital control unit). In this case, the digital control unit can obtain the logic value, determine the comparison result between the responsive voltage value and the preset voltage value based on the logic value, and then adjust the to-be-corrected parameter value based on the comparison result. For example, if the logic value is of the first value "1", it can be determined that the responsive voltage value is less than the preset voltage value based on the logic value, and if the logic value is of the second value "0", it can be determined that the responsive voltage value is greater than the preset voltage value based on the logic value. Obviously, in this implementation, because the logic value can reflect the comparison result between the responsive voltage value and the preset voltage value, the digital control unit can directly adjust the to-be-corrected parameter value based on the logic value.

In the above embodiment, when the digital control unit adjusts the to-be-corrected parameter value based on the comparison result between the responsive voltage value and the preset voltage value, the responsive voltage value can be a responsive voltage value in digital-signal, and the preset voltage value can be a preset voltage value in digital-signal, i.e., the digital control unit adjusts the to-be-corrected parameter value based on the comparison result between the responsive voltage value in digital-signal and the preset voltage value in digital-signal.

Referring to FIG. 2, the comparison logic unit 150 may output a logic value to the digital control unit 130, and if the logic value is of the first value "1", the digital control unit 130 determines that the responsive voltage value is less than the preset voltage value and increases the to-be-corrected parameter value. If the logic value is of the second value "0", the digital control unit 130 determines that the responsive voltage value is greater than the preset voltage value, and reduces the to-be-corrected parameter value.

For example, the digital control unit 130 can switch between the correction state and the readout state. In the correction state, the logic value corresponding to each pixel is obtained, and the to-be-corrected parameter value is adjusted based on the logic value, and the specific process is shown in the subsequent embodiments. In the readout state, the correction unit 120 is controlled to read the optimal correction parameter value from the storage unit 140, so as to complete a non-uniformity correction, and the comparison logic is turned off so that the responsive voltage value of the ADC 160 is output normally.

In this embodiment, in order to determine the optimal correction parameter value for the pixel, the to-be-corrected parameter value for the pixel can be adjusted by a successive approximation approach or a sequential traversal approach to obtain the optimal correction parameter value for the pixel. The successive approximation approach and the sequential traversal approach are only examples, and this is not limited in this embodiment, as long as the to-be-corrected parameter value can be adjusted to obtain the optimal correction parameter value.

Regarding the successive approximation approach, the transformation idea is similar to a balance weighing, starting with the heaviest weight, and comparing with a weighed object, if the object is heavier than the weight, the weight is retained, otherwise removed, then add the second heavy weight, . . . , and so on, until the smallest weight is added, and add all the retained weights to obtain the weight of the object. The successive approximation principle of the successive approximation approach in this embodiment is similar, except that the corresponding "weight" here is a code value of the binary number from the highest to the lowest bit. Regarding the sequential traversal approach, all the weight values can be placed in turn, and a closest value can be selected to approximate the comparison value.

In the following, the process of adjusting the to-be-corrected parameter value for the pixel by using the successive approximation approach or the sequential traversal approach to obtain the optimal correction parameter value for the pixel is described in connection with specific embodiments.

Mode 1: The digital control unit adjusts the to-be-corrected parameter value for the pixel with the successive approximation approach to obtain the optimal correction parameter value for the pixel. In mode 1, the digital control unit can adjust the to-be-corrected parameter value by the successive approximation approach. When the to-be-corrected parameter value is a K-bit binary value, a target number of adjusting is K. If the responsive voltage value is less than the preset voltage value, the digital control unit can determine a target adjustment bit of the to-be-corrected parameter value with the successive approximation approach, and if a value of the target adjustment bit is 0, modify the value of the target adjustment bit to 1. If the responsive voltage value is greater than the preset voltage value, the digital control unit can determine a target first adjustment bit and a target second adjustment bit of the to-be-corrected parameter value with the successive approximation approach, where the target first adjustment bit is a bit immediately before the target second adjustment bit; if a value of the target first adjustment bit is 1 and a value of the target second adjustment bit is 0, modify the value of the target first adjustment bit to 0 and modify the value of the target second adjustment bit to 1.

For example, if the to-be-corrected parameter value is a 4-bit binary value, such as 1000, the target number of adjusting is 4. In this case, the adjustment process of successive approximation approach can be seen in Table 1.

TABLE 1

| Number of adjusting | 1 | 2 | 3 | 4 |
|---|---|---|---|---|
| Comparison result | < | > | > | < |
| Logic value | 1 | 0 | 0 | 1 |
| To-be-corrected parameter value | 1000 (8) | 1100 (12) | 1010 (10) | 1001 (9) |
| Adjusted parameter value | 1100 (12) | 1010 (10) | 1001 (9) | 1001 (9) |

In correction period 1 (i.e., the number of adjusting is 1): the to-be-corrected parameter value is binary 1000 (decimal 8), an initial bias value is determined based on the to-be-corrected parameter value 1000 (see the subsequent embodiment for the specific process), and the initial bias value is transferred to the integral and readout unit. In this case, if the responsive voltage value Vo<the preset voltage value Vtag, i.e., the logic value is of 1, it means that the to-be-corrected parameter value 1000 is less than an optimal correction parameter value (an ultimate goal of optimization), so it is necessary to increase the to-be-corrected parameter value.

Since the to-be-corrected parameter value is 1000, i.e., the highest bit (the fourth bit) is 1 and the third bit is 0, it is the third bit that needs to be adjusted when the target adjustment bit is determined by the successive approximation approach, i.e., the target adjustment bit is the third bit (traversing from the highest bit, the target adjustment bit is a bit after a last bit with a value of 1). Since the value of the target adjustment bit is 0, the value of the target adjustment bit is changed to 1, i.e., the third bit of the to-be-corrected parameter value 1000 is changed to 1 to obtain an adjusted parameter value 1100(12).

Since the number of adjusting the to-be-corrected parameter value "1" has not reached the target number of adjusting "4", the adjusted parameter value 1100(12) can be determined as the to-be-corrected parameter value corresponding to the pixel, and the to-be-corrected parameter value 1100 (12) can be written into the storage unit, i.e., the previous to-be-corrected parameter value 1000 can be replaced.

In correction period 2 (i.e. the number of adjusting is 2): the to-be-corrected parameter value is 1100(12), an initial bias value is determined based on the to-be-corrected parameter value 1100, and the initial bias value is transferred to the integral and readout unit. In this case, if the responsive voltage value Vo>Vtag, i.e., the logic value is of 0, it means that the to-be-corrected parameter value 1100 is greater than the optimal correction parameter value, and the to-be-corrected parameter value needs to be reduced.

Since the to-be-corrected parameter value is 1100, i.e., the fourth bit is 1, the third bit is 1 and the second bit is 0, so when determining the target first adjustment bit and the target second adjustment bit with successive approximation approach, it is the third bit and the second bit that need to be adjusted, i.e., the target first adjustment bit is the third bit and the target second adjustment bit is the second bit (traversing from the highest bit, the target first adjustment bit is a last bit with a value of 1, and the target second adjustment bit is a bit that is one after the target first adjustment bit). Since the value of the target first adjustment bit is 1 and the value of the target second adjustment bit is 0, the value of the target first adjustment bit is modified to 0, and the value of the target second adjustment bit is modified to 1, i.e., the to-be-corrected parameter value 1100 is modified to an adjusted parameter value 1010(10).

Since the number of adjusting the to-be-corrected parameter value "2" has not reached the target number of adjusting "4", the adjusted parameter value 1010(10) can be determined as the to-be-corrected parameter value corresponding to the pixel, and the to-be-corrected parameter value 1010 (10) can be written into the storage unit, i.e., the previous to-be-corrected parameter value 1100 can be replaced.

In correction period 3 (i.e. the number of adjusting is 3): the to-be-corrected parameter value is 1010(10), an initial bias value is determined based on the to-be-corrected parameter value 1010, and the initial bias value is transferred to the integral and readout unit. In this case, if the responsive voltage value Vo>Vtag, i.e., the logic value is of 0, it means that the to-be-corrected parameter value 1010 is greater than the optimal correction parameter value, and the to-be-corrected parameter value needs to be reduced.

Since the to-be-corrected parameter value is 1010, i.e., the fourth bit is 1, the third bit is 0, the second bit is 1 and the first bit is 0, so when determining the target first adjustment bit and the target second adjustment bit with successive approximation approach, it is the second bit and the first bit that need to be adjusted, i.e., the target first adjustment bit is the second bit and the target second adjustment bit is the first bit. The value of the target first adjustment bit can be modified to 0, and the value of the target second adjustment bit can be modified to 1, i.e., the to-be-corrected parameter value 1010 is modified to an adjusted parameter value 1001 (9).

Since the number of adjusting the to-be-corrected parameter value "3" has not reached the target number of adjusting "4", the adjusted parameter value 1001(9) can be determined as the to-be-corrected parameter value corresponding to the pixel, and the to-be-corrected parameter value 1001(9) can be written into the storage unit, i.e., the previous to-be-corrected parameter value 1010 can be replaced.

In correction period 4 (i.e. the number of adjusting is 4): the to-be-corrected parameter value is 1001(9), an initial bias value is determined based on the to-be-corrected parameter value 1001, and the initial bias value is transferred to the integral and readout unit. If the responsive voltage value Vo<the preset voltage value Vtag, i.e., the logic value is of 1, it means that the to-be-corrected parameter value 1001 is less than the optimal correction parameter value, and the to-be-corrected parameter value needs to be increased.

the responsive voltage value is greater than the preset voltage value, the digital control unit can use the sequential traversal approach to subtract 1 from the to-be-corrected parameter value.

For example, if the to-be-corrected parameter value is a 4-bit binary value, such as 1000, the target number of adjusting is 16. In this case, the adjustment process of sequential traversal approach can be seen in Table 2. In Table 2, for the convenience of description, decimal values are used instead of binary values for the to-be-corrected parameter values and adjusted parameter values. In practical application, decimal values can be replaced with corresponding binary values.

TABLE 2

|  | Period | | | | | | | | | | | | | | | |
| --- | --- | --- | --- | --- | --- | --- | --- | --- | --- | --- | --- | --- | --- | --- | --- | --- |
|  | 1 | 2 | 3 | 4 | 5 | 6 | 7 | 8 | 9 | 10 | 11 | 12 | 13 | 14 | 15 | 16 |
| Comparison result | < | < | < | < | > | < | > | < | > | < | > | < | > | < | > | < |
| Logic value | 1 | 1 | 1 | 1 | 0 | 1 | 0 | 1 | 0 | 1 | 0 | 1 | 0 | 1 | 0 | 1 |
| To-be-corrected parameter value | 8 | 9 | 10 | 11 | 12 | 11 | 12 | 11 | 12 | 11 | 12 | 11 | 12 | 11 | 12 | 11 |
| Adjusted parameter value | 9 | 10 | 11 | 12 | 11 | 12 | 11 | 12 | 11 | 12 | 11 | 12 | 11 | 12 | 11 | 12 |

Since the to-be-corrected parameter value is 1001, i.e., the fourth bit is 1, the third bit is 0, the second bit is 0 and the first bit is 1, so when the target adjustment bit is determined with successive approximation approach, the first bit needs to be adjusted, i.e., the target adjustment bit is the first bit (the last bit with a value of 1 is the first bit, and there is no bit after the first bit, so the first bit is taken as the target adjustment bit). Since the value of the target adjustment bit is 1, the target adjustment bit cannot be increased (i.e., the value of the target adjustment bit cannot be adjusted from 0 to 1), so the value of the target adjustment bit is kept unchanged at 1, and an adjusted parameter value 1001(9) is obtained.

Since the number of adjusting the to-be-corrected parameter value "4" has reached the target number of adjusting "4", the adjusted parameter value 1001(9) can be determined as the optimal correction parameter value corresponding to the pixel, and the optimal correction parameter value 1010 (9) can be written into the storage unit, i.e., the previous to-be-corrected parameter value 1001 stored in the storage unit can be replaced.

So far, after four correction periods, the optimal correction parameter value 1001(9) for the pixel is successfully found, and the optimal correction parameter value 1001 makes the responsive voltage value Vo of the pixel closest to the preset voltage value Vtag. To sum up, for each pixel, the digital control unit can obtain the optimal correction parameter value for the pixel and write the optimal correction parameter value for the pixel into the storage unit.

Mode 2: The digital control unit can adjust the to-be-corrected parameter value for the pixel with the sequential traversal approach to obtain the optimal correction parameter value for the pixel. In mode 2, the digital control unit can adjust the to-be-corrected parameter value by the sequential traversal approach. For example, when the to-be-corrected parameter value is a K-bit binary value, a target number of adjusting can be K-power of 2. For example, if the responsive voltage value is less than the preset voltage value, the digital control unit can use the sequential traversal approach to add 1 to the to-be-corrected parameter value. If In correction period 1 (i.e., the number of adjusting is 1): the to-be-corrected parameter value is decimal 8 (binary 1000), an initial bias value may be determined based on the to-be-corrected parameter value 8 (see the subsequent embodiment for the determination process), and the initial bias value is transferred to the integral and readout unit. In this case, if the responsive voltage value Vo<the preset voltage value Vtag, i.e. the logic value is of 1, it means that the to-be-corrected parameter value 8 is less than the optimal correction parameter value, and it is necessary to increase the to-be-corrected parameter value. Since the to-be-corrected parameter value is 8, the to-be-corrected parameter value can be increased by 1 with the sequential traversal approach to obtain an adjusted parameter value 9(1001). Since the number of adjusting "1" has not reached the target number of adjusting "16", the adjusted parameter value 9 can be determined as the to-be-corrected parameter value corresponding to the pixel, and the to-be-corrected parameter value 9 can be written into the storage unit.

In correction period 2 (i.e. the number of adjusting is 2): the to-be-corrected parameter value is 9, an initial bias value is determined based on the to-be-corrected parameter value 9, and the initial bias value is transferred to the integral and readout unit. If the responsive voltage value Vo<the preset voltage value Vtag, i.e., the logic value is of 1, the to-be-corrected parameter value can be increased. For example, the sequential traversal approach is used to add 1 to the to-be-corrected parameter value 9 to obtain an adjusted parameter value of 10(1010). Since the number of adjusting "2" has not reached the target number of adjusting "16", the adjusted parameter value 10 is determined as the to-be-corrected parameter value and written into the storage unit.

In correction period 5 (i.e. the number of adjusting is 5): the to-be-corrected parameter value is 12, an initial bias value is determined based on the to-be-corrected parameter value 12, and the initial bias value is transferred to the integral and readout unit. If the responsive voltage value Vo>the preset voltage value Vtag, i.e., the logic value is of 0, the to-be-corrected parameter value can be reduced. For example, by using the sequential traversal approach to subtract 1 from to-be-corrected parameter value 12, the adjusted parameter value 11 can be obtained. Since the number of adjusting "5" has not reached the target number of adjusting "16", the adjusted parameter value 11 is determined as the to-be-corrected parameter value and written into the storage unit.

In correction period 16 (i.e. the number of adjusting is 16): the to-be-corrected parameter value is 11, an initial bias value is determined based on the to-be-corrected parameter value 11, and the initial bias value is transferred to the integral and readout unit. If the responsive voltage value Vo<the preset voltage value Vtag, i.e., the logic value is of 1, the to-be-corrected parameter value can be increased. For example, the sequential traversal approach is used to add 1 to the to-be-corrected parameter value 11 to obtain an adjusted parameter value 12. Since the number of adjusting the to-be-corrected parameter value "16" has reached the target number of adjusting "16", the adjusted parameter value 12 can be determined as the optimal correction parameter value corresponding to the pixel, and the optimal correction parameter value 12 can be written into the storage unit, i.e., the previous to-be-corrected parameter value 11 stored in the storage unit can be replaced.

So far, after 16 correction periods, the optimal correction parameter value 12(1100) for the pixel is successfully found, and the optimal correction parameter value 12 makes the responsive voltage value Vo of the pixel closest to the preset voltage value Vtag.

To sum up, for each pixel, the digital control unit can obtain the optimal correction parameter value for the pixel and write the optimal correction parameter value for the pixel into the storage unit.

To sum up, the digital control unit can determine the optimal correction parameter value for each pixel in the infrared FPA and write the optimal correction parameter value into the storage unit.

The storage unit is configured to store the to-be-corrected parameter value for the pixel, and is configured to store the optimal correction parameter value for the pixel after the digital control unit has obtained the optimal correction parameter value.

For example, when the successive approximation approach is adopted, the digital control unit can acquire the binary 1000 of the to-be-corrected parameter value and write it into the storage unit, and the storage unit stores the to-be-corrected parameter value 1000. In correction period 1, the digital control unit acquires the to-be-corrected parameter value 1100 and writes the to-be-corrected parameter value 1100 into the storage unit, and the storage unit stores the to-be-corrected parameter value 1100. In correction period 2, the digital control unit acquires the to-be-corrected parameter value 1010 and writes the to-be-corrected parameter value 1010 into the storage unit, and the storage unit stores the to-be-corrected parameter value 1010. In correction period 3, the digital control unit acquires the to-be-corrected parameter value 1001 and writes the to-be-corrected parameter value 1001 into the storage unit, and the storage unit stores the to-be-corrected parameter value 1001. In correction period 4, the digital control unit acquires an optimal correction parameter value 1001 and writes it into the storage unit, and the storage unit stores the optimal correction parameter value 1001.

When the sequential traversal approach is adopted, the storage process of the storage unit is similar, so this embodiment will not be repeated here.

For example, when the to-be-corrected parameter value is a K-bit binary value, the storage unit may include K data regions, and the K data regions correspond to the Kbits of the binary value one by one. On this basis, when the storage unit stores the to-be-corrected parameter value corresponding to the pixel, a m-th bit value of the to-be-corrected parameter value is stored by a m-th data region, and a value range of m is 1 to K. When the storage unit stores the optimal correction parameter value corresponding to the pixel, the m-th bit value of the optimal correction parameter value is stored by the m-th data region.

For example, when the to-be-corrected parameter value is a 4-bit binary value, the storage unit may include 4 data regions, which are recorded as data region 1, data region 2, data region 3, and data region 4, respectively. Data region 1 corresponds to the first bit (i.e., the lowest bit) of the to-be-corrected parameter value, data region 2 corresponds to the second bit of the to-be-corrected parameter value, data region 3 corresponds to the third bit of the to-be-corrected parameter value, and data region 4 corresponds to the fourth bit (i.e. the highest bit) of the to-be-corrected parameter value. On this basis, the storage unit stores the first bit value in the to-be-corrected parameter value (or the optimal correction parameter value) in data region 1, stores the to-be-corrected parameter value (or the optimal correction parameter value) in data region 2, stores the third bit value of the to-be-corrected parameter value (or the optimal correction parameter value) in data region 3, and stores the to-be-corrected parameter value (or the optimal correction parameter value) in data region 4.

To sum up, for the storage process of the to-be-corrected parameter value corresponding to each pixel (the storage mode of the optimal correction parameter value is similar, which will not be described in detail later), the first bit value of the to-be-corrected parameter value is stored in data region 1, then the second bit value of the to-be-corrected parameter value is stored in data region 2, then the third bit value of the to-be-corrected parameter value is stored in data region 3, and then the fourth bit value of the to-be-corrected parameter value is stored in data region 4. For the reading process of the to-be-corrected parameter value corresponding to each pixel, first read the first bit value of the to-be-corrected parameter value from data region 1, then read the second bit value of the to-be-corrected parameter value from data region 2, then read the third bit value of the to-be-corrected parameter value from data region 3, and then read the fourth bit value of the to-be-corrected parameter value from data region 4. After obtaining the above four values, the above four values can be spliced together to obtain the to-be-corrected parameter value.

For example, in the correction state, the storage unit can cooperate with the digital control unit to store the to-be-corrected parameter values, and the to-be-corrected parameter values can be updated every correction period. After the correction state is completed, the storage unit may store the optimal correction parameter values. In the readout state, the optimal correction parameter value corresponding to the pixel can be read from the storage unit, and a subsequent correction process can be carried out based on the optimal correction parameter value.

For example, the storage unit may use a static random access memory (SRAM) to store the to-be-corrected parameter values, that is, the storage unit stores the to-be-corrected parameter value for each pixel. As shown in FIG. 1, if the total number of pixels is M*N and the to-be-corrected parameter value is a binary value of K bits, the storage size of the storage unit can be M*N*K bits. For the convenience of description, take the total number of pixels as 196*264 and the K-bit binary value is a 4-bit binary value as an example.

Figure 3:
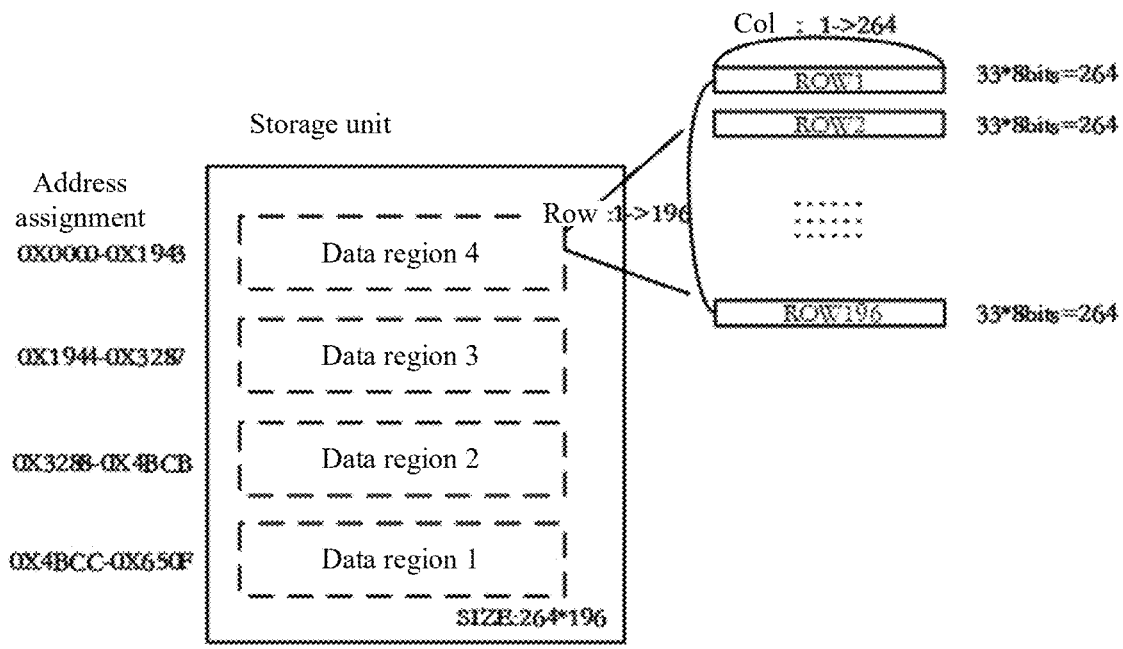
FIG. 3 is a schematic diagram of a storage format of a storage unit according to an embodiment of the present disclosure.

Referring to FIG. 3, a schematic diagram of a storage format of the storage unit is shown, where the storage unit may be divided into four data regions, noted as data region 1, data region 2, data region 3, and data region 4, respectively.

First bit value of to-be-corrected parameter value for each pixel (for example, 196*264 pixels) is stored in data region 1, for example, first bit values of to-be-corrected parameter values for 264 pixels in row 1 are stored first, then first bit values of to-be-corrected parameter values for 264 pixels in row 2 are stored, and so on, and finally first bit values of to-be-corrected parameter values for 264 pixels in row 196 are stored.

In addition, second bit value of to-be-corrected parameter value for each pixel is stored in data region 2, for example, second bit values of to-be-corrected parameter values for 264 pixels in row 1 are stored first, and so on, and finally second bit values of to-be-corrected parameter values for 264 pixels in row 196 are stored.

In addition, third bit value of to-be-corrected parameter value for each pixel is stored in data region 3, for example, third bit values of to-be-corrected parameter values for 264 pixels in row 1 are stored first, and so on, and finally third bit values of to-be-corrected parameter values for 264 pixels in row 196 are stored.

In addition, fourth bit value of to-be-corrected parameter value for each pixel is stored in data region 4, for example, fourth bit values of to-be-corrected parameter values for 264 pixels in row 1 are stored first, and so on, and finally fourth bit values of to-be-corrected parameter values for 264 pixels in row 196 are stored.

For example, since SRAM is written in address single word (8bits), then an assigned address range of each row is 0 to 32 (264/8=33), and a size of the assigned address range for each bit of to-be-corrected parameter values is 33*196=6468, so address ranges of the 4 data regions are, in order, as follows: data region 4: 0x0000 to 0x1943, data region 3: 0x1944 to 0x3287, data region 2: 0x3288 to 0x4BCB, and data region 1: 0x4BCC to 0x650F.

Figure 4:
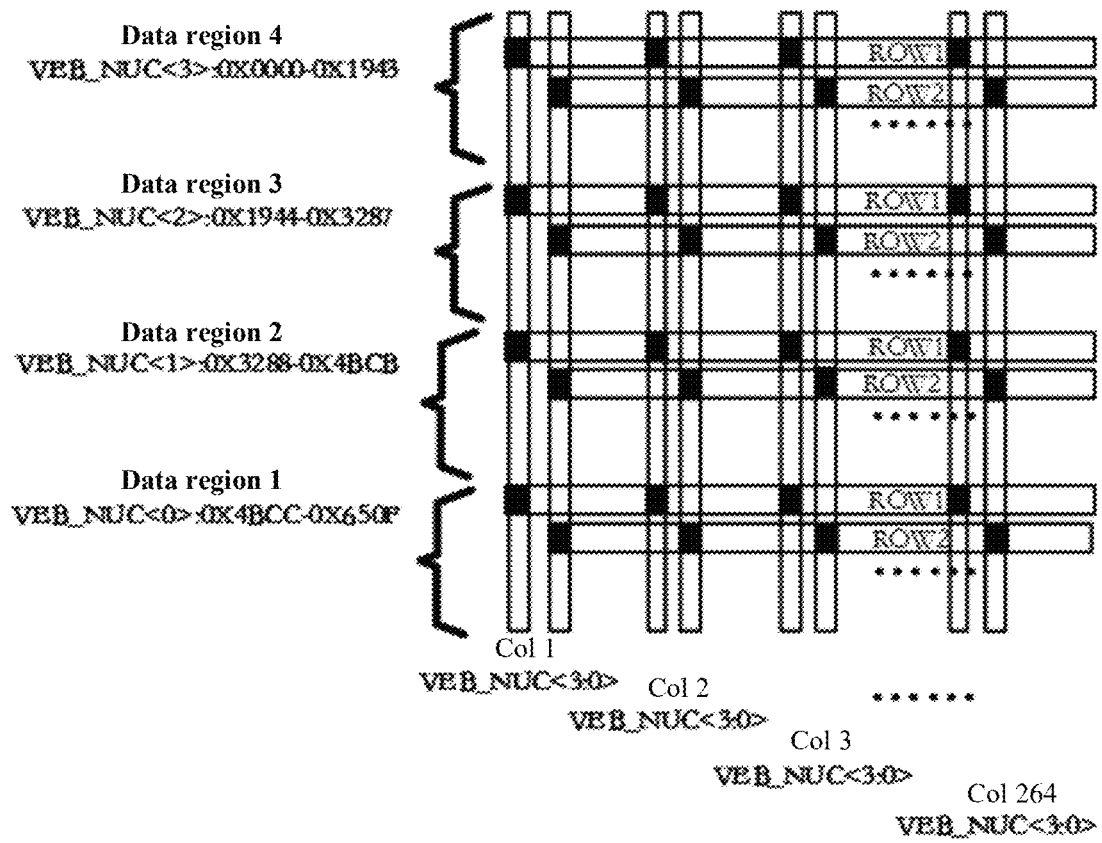
FIG. 4 is a schematic diagram of reading a to-be-corrected parameter value from a storage unit according to an embodiment of the present disclosure.

As shown in FIG. 4, it is a schematic diagram of reading a to-be-corrected parameter value from the storage unit. When acquiring the to-be-corrected parameter value from the storage unit, one-bit values can be read from data region 1, data region 2, data region 3 and data region 4 of the storage unit respectively, the readout values can be spliced, and the to-be-corrected parameter value can be obtained after the splicing is completed. For example, the first bit of the to-be-corrected parameter value is read from the data region 1, the second bit of the to-be-corrected parameter value is read from the data region 2, the third bit of the to-be-corrected parameter value is read from the data region 3, and the fourth bit of the to-be-corrected parameter value is read from the data region 4, and then splice the above 4 values. After the splicing is completed, the to-be-corrected parameter value can be obtained.

The correction unit is configured to acquire the to-be-corrected parameter value for the pixel, determine an initial bias value based on the to-be-corrected parameter value for the pixel, and transfer the initial bias value to the integral and readout unit. For example, the to-be-corrected parameter value can be directly read from the storage unit by the correction unit, or the to-be-corrected parameter value can be read from the storage unit by the digital control unit and sent to the correction unit.

For example, the correction unit may include a digital to analog converter (DAC), which performs digital-to-analog conversion on the to-be-corrected parameter value of a digital signal to obtain an analog voltage signal, and determines a voltage value corresponding to the analog voltage signal as the initial bias value.

As shown in FIG. 2, the to-be-corrected parameter value can be recorded as VEB_NUC, which can be a 4-bit binary value, and the DAC in the correction unit 120 can convert the to-be-corrected parameter value VEB_NUC of digital signal into an analog voltage signal.

On this basis, a voltage value corresponding to the analog voltage signal can be taken as the initial bias value VEB, and the initial bias value VEB can be transferred to the integral and readout unit 110, i.e., the initial bias value VEB can be taken as the input voltage of the first MOS transistor 111, so that the current I1 passing through the first MOS transistor 111 can be controlled.

Obviously, different initial bias values VEB can provide different biases for the integral and readout unit 110. When the initial bias value VEB is larger, the responsive voltage value Vo corresponding to the pixel is larger, thus eliminating the problem that the integral and readout unit has different responses to the same radiation caused by manufacturing deviation.

For example, when the successive approximation approach is used, the correction unit obtains the to-be-corrected parameter value 1000 in the correction period 1, determines the initial bias value VEB based on the to-be-corrected parameter value 1000, and transfers the initial bias value VEB to the integral and readout unit. In the correction period 2, the to-be-corrected parameter value is 1100. Based on the to-be-corrected parameter value 1100, the initial bias value VEB is determined and transferred to the integral and readout unit. In the correction period 3, the to-be-corrected parameter value is 1010. Based on the to-be-corrected parameter value 1010, the initial bias value VEB is determined and transferred to the integral and readout unit. In the correction period 4, the to-be-corrected parameter value is 1001. Based on the to-be-corrected parameter value 1001, the initial bias value VEB is determined and transferred to the integral and readout unit.

To sum up, the description of the correction state is completed. In the correction state, optimal correction parameter value corresponding to each pixel can be obtained, and the optimal correction parameter value can be written into the storage unit. After the correction state is completed, the readout state can be performed. In the readout state, the shutter can be closed, so that the external ambient temperature sensed by each pixel is an actual target temperature value of the target scene.

In a possible implementation, the optimal correction parameter value corrects the actual target temperature value sensed by the pixel. That is, in the readout state, the actual target temperature value sensed by the pixel can be corrected based on the optimal correction parameter value. In this way, the purpose of correcting the actual target temperature value sensed by the pixel is achieved by correcting the responsive voltage value Vo of the integral and readout unit.

The process of using the optimal correction parameter value is described below in connection with specific embodiments.

The digital control unit can determine a state for the readout circuit, for example, after the readout circuit is powered on and started, it can be determined that the readout circuit is in a correction state. After the optimal correction parameter value for the pixel has been determined, it can be determined that the readout circuit is in the readout state. Further, when the readout circuit is in the correction state, the digital control unit controls the shutter to open, so that respective pixels in the infrared FPA can sense the temperature value of the shutter. When the readout circuit is in the readout state, the digital control unit controls the shutter to close, so that respective pixels in the infrared FPA can sense an actual target temperature value of a target scene.

When the readout circuit is in the readout state, the correction unit can determine a target bias value based on the optimal correction parameter value for the pixel, and transfer target bias value to the integral and readout unit. The integral and readout unit can determine the responsive voltage value for the pixel based on a third current corresponding to the target bias value and a fourth current caused by the pixel in response to the temperature value. The comparison logic unit, after receiving the responsive voltage value for the pixel, outputs the responsive voltage value to the outside, i.e., outputs the responsive voltage value to an external processor, so that the external processor determines an actual target temperature value based on the responsive voltage value.

Referring to FIG. 2, the storage unit 140 has stored the optimal correction parameter value for the pixel Rs, and the correction unit 120 may acquire the optimal correction parameter value for the pixel Rs from the storage unit 140 (which may be read directly from the storage unit 140 by the correction unit 120, or may be read from the storage unit 140 and sent to the correction unit 120 by the digital control unit 130), determine a target bias value VEB based on the optimal correction parameter value, and transfer the target bias value VEB to the integral and readout unit 110, such as to the first MOS transistor 111 of the integral and readout unit 110.

The integral and readout unit 110 is configured to determine a third current I1 corresponding to the target bias value VEB and a fourth current I2 of the pixel Rs, and the fourth current I2 matches the actual target temperature value sensed by the pixel Rs (i.e., the actual target temperature value sensed by the pixel Rs after the shutter is closed). On this basis, the integral and readout unit 110 can determine a responsive voltage value Vo corresponding to the pixel Rs based on the third current I1 and the fourth current I2. The responsive voltage value Vo can determine a temperature value of a target object of the target scene. For example, the responsive voltage value Vo can be provided to an external processor, and the external processor can query a mapping relationship between a pre-calibrated voltage value and the temperature value to obtain a temperature value corresponding to the responsive voltage value Vo. This temperature value is also the temperature value of the target object, i.e., a final detected temperature value, for which the temperature value determination process is not restricted.

As shown in FIG. 2, in the readout state, when the target bias value VEB is larger, the third current I1 passing through the first MOS transistor 111 is larger, i.e., the target bias value VEB is positively correlated with the third current I1, so that the target bias value VEB is controlled by the optimal correction parameter value, and then the third current I1 is controlled by the target bias value VEB, thereby affecting the responsive voltage value Vo corresponding to the pixel Rs, and achieving the purpose of non-uniformity correction.

When the readout circuit is in the correction state, the digital control unit can send a first control signal to the comparison logic unit, so that the comparison logic unit determines that the readout circuit is in the correction state based on the first control signal, determines the logic value based on the responsive voltage value and the preset voltage value when receiving the responsive voltage value, and outputs the logic value to the digital control unit. When the readout circuit is in the readout state, the digital control unit can send a second control signal to the comparison logic unit, so that the comparison logic unit determines that the readout circuit enters the readout state based on the second control signal, outputs the responsive voltage value when receiving the responsive voltage value, i.e., output the responsive voltage value to an external processor.

As can be seen from the above technical solution, the embodiments of the present disclosure design a readout circuit capable of automatically performing non-uniformity correction on an uncooled infrared chip, referred to as a readout circuit of infrared FPA. Non-uniformity correction is realized by the readout circuit without the need of non-uniformity correction by an external processor, which reduces the overhead of external hardware resources, reduces the cost, is simple to develop and has good correction effect. The so-called non-uniformity correction refers to correcting response differences of different pixels to the same infrared radiation by providing different bias values to different pixels, so that responses of different pixels to the same infrared radiation are consistent. In practical application, a suitable correction algorithm (e.g., a sequential traversal approach or a successive approximation approach known to those skilled in the art) may be selected according to the scenario to update the optimal correction parameter value.

Figure 5:
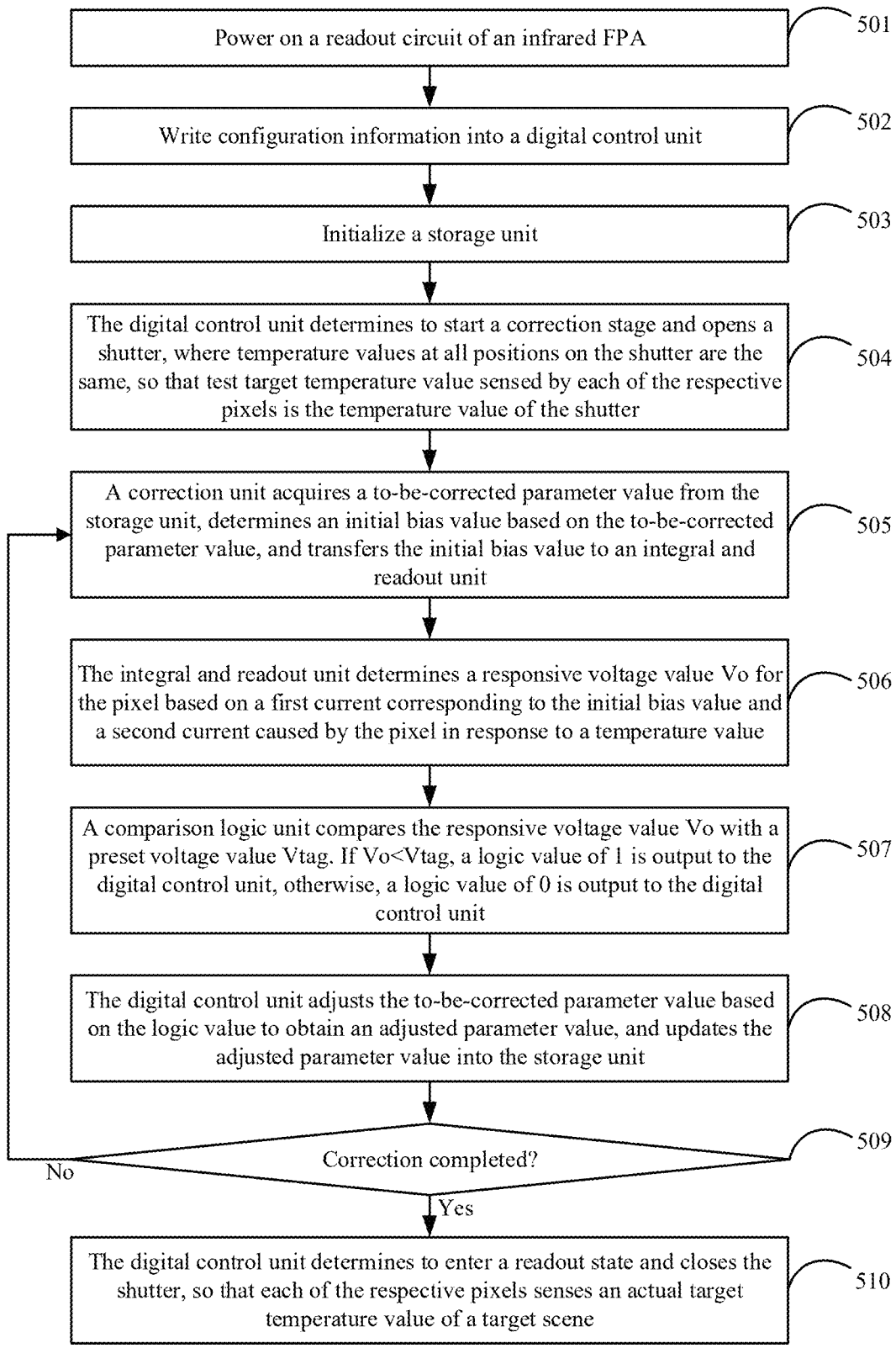
FIG. 5 is a schematic diagram of a working flow of a readout circuit of infrared FPA according to an embodiment of the present disclosure.

Referring to FIG. 5, which is a schematic diagram of a working flow of the readout circuit of an infrared FPA, the method may include the following steps.

At step 501: a readout circuit of an infrared FPA is powered on.

At step 502: after power-on, configuration information can be written into a digital control unit, such as row time, integration time, to-be-corrected parameter value (such as binary value 1000 in the above embodiment), preset voltage value and correction algorithm type. The correction algorithm type can be sequential traversal approach or successive approximation approach.

At step 503: a storage unit is initialized. For example, the digital control unit writes an initial to-be-corrected parameter value for each pixel into the storage unit. For a plurality of pixels included in the infrared FPA, initial to-be-corrected parameter values corresponding to different pixels may be the same or different.

At step 504: the digital control unit determines to enter a correction state and opens a shutter, where temperature values at all positions on the shutter are the same, so that test target temperature value sensed by each of the respective pixels is the temperature value of the shutter.

At step 505: a correction unit acquires a to-be-corrected parameter value from the storage unit, determines an initial bias value based on the to-be-corrected parameter value, and transfers the initial bias value to an integral and readout unit.

At step 506: the integral and readout unit determines a responsive voltage value Vo for the pixel based on a first current corresponding to the initial bias value and a second current caused by the pixel in response to a temperature value.

At step 507: a comparison logic unit compares the responsive voltage value Vo with a preset voltage value Vtag. If Vo<Vtag, the logic value of 1 is output to the digital control unit, otherwise, the logic value of 0 is output to the digital control unit.

At step 508: the digital control unit adjusts the to-be-corrected parameter value based on the logic value to obtain an adjusted parameter value, and updates the adjusted parameter value into the storage unit, thereby replacing a previous to-be-corrected parameter value.

At step 509: determine whether the correction is completed. If it is completed, the adjusted parameter value updated into the storage unit will be taken an optimal correction parameter value, and step 510 will be executed. If it is not completed, the adjusted parameter value updated into the storage unit will be taken as the to-be-corrected parameter value, and step 505 is executed again based on the to-be-corrected parameter value.

At step 510: the digital control unit determines to enter a readout state and closes the shutter, so that each of the respective pixels senses an actual target temperature value of a target scene. In the readout state, the correction unit obtains the optimal correction parameter value from the storage unit, determines a target bias value based on the optimal correction parameter value, and transfers the target bias value to the integral and readout unit. The integral and readout unit determines the responsive voltage value Vo for the pixel based on a third current corresponding to the target bias value and a fourth current caused by the pixel in response to the temperature value. Finally, the responsive voltage value Vo is output to an external processor, so as to determine the temperature value corresponding to the pixel.

In the following, a working sequence of readout circuit of infrared FPA is briefly explained in combination with specific application scenarios. After the readout circuit is powered on, the readout circuit starts a correction stage, and after the correction is completed, the readout circuit starts a readout stage. In this case, an operating state of the readout circuit can be indicated by ON_CHIP_NUC, with ON_CHIP_NUC=1, indicating the correction stage, and ON_CHIP_NUC=0, indicating the readout stage. Take the total number of pixels as 196*264 and the to-be-corrected parameter value as a 4-bit binary value as an example for explanation.

The correction stage can be divided into two stages. The first stage is initialization, i.e., initializing to-be-corrected parameter values. In the first stage, only an initialization write operation of the storage unit is performed, and initialization of to-be-corrected parameter values for all columns in each row is completed under a selection signal of each row. For example, initial to-be-corrected parameter values for all columns in this row may be binary 1000.

The second stage is correction processing, i.e., correcting the to-be-corrected parameter values. In the second stage, it is necessary to perform read and write operations on the storage unit to load the preset to-be-corrected parameter values one row in advance, i.e., to read the corresponding to-be-corrected parameter values from the storage unit, and to configure the to-be-corrected parameter values into the correction unit. Then, when the row is to be read and compared, configuring a next frame of to-be-corrected parameter values for columns corresponding to the row and updating data of a current correction bit are completed in turn. When the successive approximation approach is used to realize correction, every row and every 8 columns are regarded as an operation cycle. At the beginning of each cycle, the data for a next frame of to-be-corrected parameter values is configured, and after the comparison of the 8 columns is completed, the 8 columns of comparison correction data are written into the corresponding address unit. By doing this for each cycle, updating data of the current correction bit corresponding to this row can be completed, and the data for a next frame of to-be-corrected parameter values can be written.

When the sequential traversal approach is used to realize the correction, in the correction stage, the correction data is configured in a manner different from that of the successive approximation approach, with every row and every 8 columns as an operation cycle. To-be-corrected parameter values used by the row and the eight columns are read out at each operation cycle. After the comparison of the 8 columns is completed, the digital control unit will increase or decrease the to-be-corrected parameter values by 1 according to the comparison result, and save the 8-column correction data in first two cycles of the next 8-column cycle. By analogy, the writing of the correction data after the comparison is completed. There is no need to perform NUC write operations on the first 8 columns of the first row in each frame. The correction data of the last 8 columns of the middle row will perform write operation in the first 8 columns of the next row. After the last 8 columns of the last row, there will be an additional 2 column cycles for writing the correction data of these 8 columns.

Based on the same application concept as the above-mentioned readout circuit of infrared FPA, another readout circuit of infrared FPA is proposed in the embodiment of the present disclosure, which may include but not limited to an integral and readout unit, a correction unit and a digital control unit. The integral and readout unit is connected with an infrared FPA, and the infrared FPA includes a plurality of pixels. For each pixel in the infrared FPA, the correction unit is configured to determine an initial bias value based on a to-be-corrected parameter value for the pixel and transfer the initial bias value to the integral and readout unit; the integral and readout unit is configured to determine a responsive voltage value for the pixel based on a first current corresponding to the initial bias value and a second current caused by the pixel in response to a temperature value; the digital control unit is configured to obtain an adjusted parameter value by adjusting to-be-corrected parameter value based on a comparison result of the responsive voltage value and a preset voltage value, and determine an optimal correction parameter value for the pixel based on the adjusted parameter value, the optimal correction parameter value is used for correcting an actual target temperature value sensed by the pixel.

In a possible embodiment, the readout circuit of infrared FPA may further include a storage unit. In this case, the digital control unit is further configured to acquire the to-be-corrected parameter value for the pixel and write the to-be-corrected parameter value into the storage unit, and the storage unit stores the to-be-corrected parameter value. On this basis, the correction unit is further configured to acquire the to-be-corrected parameter value for the pixel from the storage unit. For a plurality of pixels included in the infrared FPA, to-be-corrected parameter values corresponding to different pixels may be the same or different.

In a possible embodiment, the correction unit may include a DAC. In this way, the correction unit can perform digital-to-analog conversion on the to-be-corrected parameter value of a digital-signal to obtain an analog voltage signal, and determines a voltage value corresponding to the analog voltage signal as the initial bias value.

In a possible implementation, when the to-be-corrected parameter value is a K-bit binary value, the storage unit includes K data regions, the K data regions correspond to Kbits of the binary value one by one, and K is a positive integer greater than 1. For example, the storage unit is configured to store a m-th bit value of the to-be-corrected parameter value in a m-th data region, and a value range of m can be 1 to K.

In a possible embodiment, the integral and readout unit may include a first MOS transistor and an integration circuit. An input voltage of the first MOS transistor is the initial bias value, and a current passing through the first MOS transistor is a first current corresponding to the initial bias value. The integration circuit is connected with the first MOS transistor and the pixel. A sum of the first current and the second current can be determined as an input current of the integration circuit, so that the input current can be integrated by the integration circuit to obtain a voltage input value for the pixel. The responsive voltage value for the pixel can be determined based on the voltage input value for the pixel.

The integral and readout unit may further include a sample-and-hold circuit, and the sample-and-hold circuit is connected with the integration circuit. The voltage input value for the pixel can be input to the sample-and-hold circuit, so that the voltage input value is sampled and held by the sample-and-hold circuit to obtain the responsive voltage value for the pixel.

In a possible implementation, when the digital control unit determines the optimal correction parameter value for the pixel based on the adjusted parameter value, if a number of adjusting the to-be-corrected parameter value has reached a target number of adjusting, the digital control unit takes the adjusted parameter value as the optimal correction parameter value for the pixel; or, if the number of adjusting does not reach the target number of adjusting, the digital control unit takes the adjust parameter value as the to-be-corrected parameter value for the pixel, and repeats the correction process.

In a possible embodiment, when the digital control unit adjusts the to-be-corrected parameter value, if the responsive voltage value is less than the preset voltage value, the digital control unit increases the to-be-corrected parameter value; if the responsive voltage value is greater than the preset voltage value. the digital control unit reduces the to-be-corrected parameter value.

In a possible embodiment, the readout circuit of infrared FPA may further include a comparison logic unit, the comparison logic unit is configured to determine a logic value based on a responsive voltage value and a preset voltage value, and to output the logic value to the digital control unit. For example, if the responsive voltage value is less than the preset voltage value, the logic value is of a first value, and if the responsive voltage value is greater than the preset voltage value, the logic value is of a second value. Correspondingly, the digital control unit is further configured to determine a comparison result between the responsive voltage value and the preset voltage value based on the logic value. For example, if the logic value is of the first value, it is determined that the responsive voltage value is less than the preset voltage value, and if the logic value is of the second value, it is determined that the responsive voltage value is greater than the preset voltage value.

In a possible embodiment, the readout circuit of infrared FPA further includes an ADC, and the ADC is configured to: acquire the responsive voltage value from the integral and readout unit; obtain a responsive voltage value in digital-signal by performing an analog-to-digital conversion on the responsive voltage value; and output the responsive voltage value in digital-signal to the digital control unit, so that the digital control unit can adjust the to-be-corrected parameter value based on the comparison result of the responsive voltage value in digital-signal and a preset voltage value in digital-signal.

In a possible embodiment, the digital control unit is further configured to determine a state of the readout circuit of infrared FPA. For example, in a case that the readout circuit is powered on and started, the readout circuit will be in a correction permission state, i.e., it can selectively enter the correction state as needed. After the optimal correction parameter value for the pixel has been determined, the readout circuit enters a readout state. The digital control unit is further configured to control a shutter to open when the readout circuit is in the correction state, so that respective pixels in the infrared FPA can sense a temperature value of the shutter, and control the shutter to close when the readout circuit enters the readout state, so that each of the respective pixels in the infrared FPA senses an actual target temperature value of a target scene.

In a possible embodiment, the digital control unit is further configured to send a first control signal to the comparison logic unit when the readout circuit is in the correction state, so that the comparison logic unit determines that the readout circuit is in the correction state based on the first control signal, determines the logic value based on the responsive voltage value and the preset voltage value when receiving the responsive voltage value, and outputs the logic value to the digital control unit. When the readout circuit enters the readout state, the digital control unit sends a second control signal to the comparison logic unit, so that the comparison logic unit determines that the readout circuit enters the readout state based on the second control signal, outputs the responsive voltage value, such as outputs the responsive voltage value to an external memory, when receiving the responsive voltage value.

In a possible implementation, when the readout circuit is in the readout state, the correction unit is configured to determine a target bias value based on the optimal correction parameter value for the pixel, and transfer the target bias value to the integral and readout unit. The integral and readout unit is configured to determine the responsive voltage value for the pixel based on a third current corresponding to the target bias value and a fourth current caused by the pixel in response to the temperature value. The comparison logic unit is configured to output the responsive voltage value after receiving the responsive voltage value for the pixel.

Figure 6:
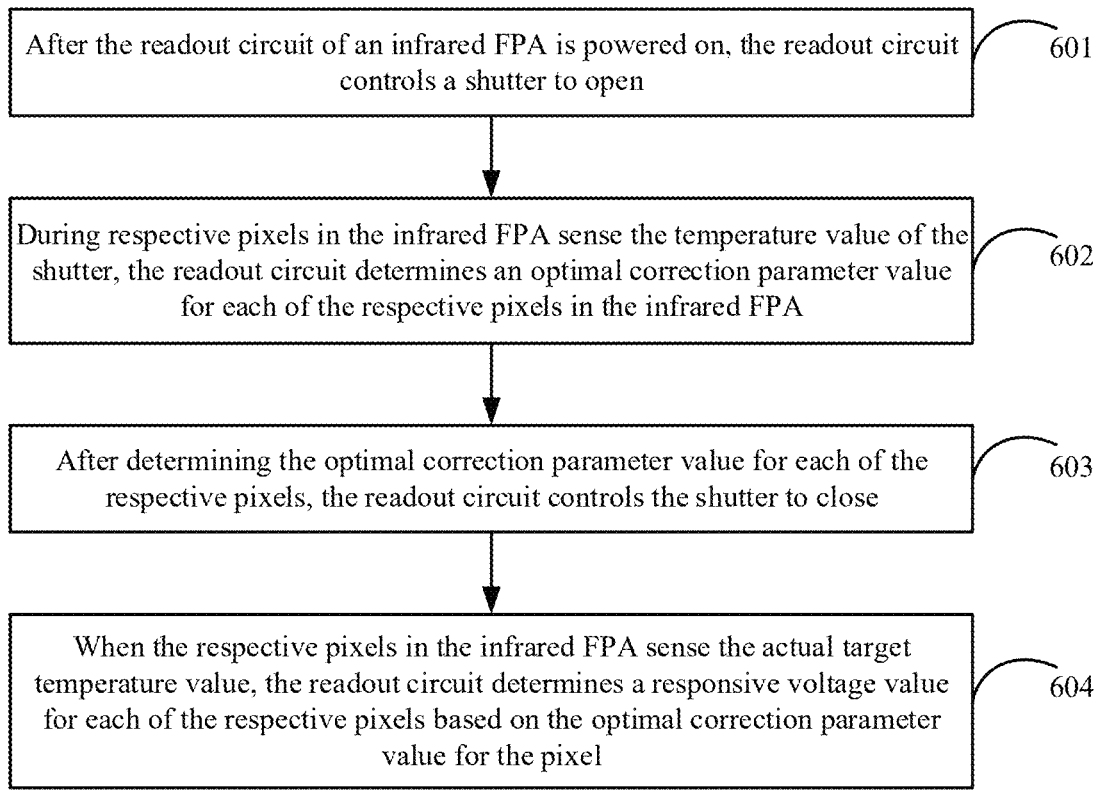
FIG. 6 is a flowchart of a control method of a readout circuit of infrared FPA according to an embodiment of the present disclosure.

Based on the same application concept as the above-mentioned readout circuit, a control method of a readout circuit of infrared FPA is proposed in the embodiment of the present disclosure, the readout circuit of infrared FPA is connected with an infrared FPA, and the infrared FPA may include a plurality of pixels. See FIG. 6 for a schematic flow diagram of the method, which may include the following steps.

At step 601, after the readout circuit is powered on, the readout circuit controls a shutter to open, so that respective pixels in the infrared FPA sense a temperature value of the shutter. For example, the temperature value of all positions on the shutter can be the same, so that the respective pixels in the infrared FPA sense the same temperature value of the shutter.

At step 602, during the respective pixels in the infrared FPA sense the temperature value of the shutter, the readout circuit determines an optimal correction parameter value for each of the respective pixels in the infrared FPA.

At step 603, after determining the optimal correction parameter value for each of the respective pixels, the readout circuit controls the shutter to close, so that each of the respective pixels in the infrared FPA senses an actual target temperature value of a target scene.

At step 604, when the respective pixels in the infrared FPA sense the actual target temperature value, the readout circuit determines a responsive voltage value for each of the respective pixels based on the optimal correction parameter value for the pixel, and outputs the responsive voltage value for each of the respective pixels in the infrared FPA, i.e., outputs the responsive voltage value to an external processor.

In a possible implementation, the readout circuit determines an optimal correction parameter value for the each pixel in the infrared FPA, which may include, but is not limited to: for each pixel, determine an initial bias value based on a to-be-corrected parameter value for the pixel; determine a responsive voltage value for the pixel based on a first current corresponding to the initial bias value and a second current caused by the pixel in response to a temperature value; and obtain an adjusted parameter value by adjusting the to-be-corrected parameter value based on a comparison result of the responsive voltage value and a preset voltage value, and determine an optimal correction parameter value for the pixel based on the adjusted parameter value. For example, an initial to-be-corrected parameter value and the preset voltage value are both pre configured. For multiple pixels of the infrared FPA, to-be-corrected parameter values for different pixels can be the same or different, and preset voltage values for different pixels can be the same.

For example, determining an initial bias value based on a to-be-corrected parameter value for the pixel, which may include but is not limited to: performing a digital-to-analog conversion on the to-be-corrected parameter value of a digital-signal to obtain an analog voltage signal, and determining a voltage value corresponding to the analog voltage signal as the initial bias value.

For example, determining a responsive voltage value for the pixel based on a first current corresponding to the initial bias value and a second current caused by the pixel in response to a temperature value, which may include, but is not limited to: determining a sum of the first current and the second current as an input current; obtaining a voltage input value for the pixel by performing integral operation on the input current; and determining the responsive voltage value for the pixel based on the voltage input value for the pixel.

For example, adjusting the to-be-corrected parameter value based on a comparison result of the responsive voltage value and a preset voltage value may include, but is not limited to: if the responsive voltage value is less than the preset voltage value, increasing the to-be-corrected parameter value; and if the responsive voltage value is greater than the preset voltage value, reducing the to-be-corrected parameter value.

For example, determining the optimal correction parameter value for the pixel based on the adjusted parameter value may include: if a number of adjusting the to-be-corrected parameter value has reached a target number of adjusting, taking the adjusted parameter value as the optimal correction parameter value for the pixel; if the number of adjusting the to-be-corrected parameter value does not reach the target number of adjusting, taking the adjusted parameter value as the to-be-corrected parameter value for the pixel, and returning to perform an operation of adjusting the to-be-corrected parameter value based on the comparison result of the responsive voltage value and the preset voltage value.

For example, when the to-be-corrected parameter value is a K-bit binary value, K is a positive integer greater than 1, adjusting the to-be-corrected parameter value based on a comparison result of the responsive voltage value and a preset voltage value may include, but is not limited to: adjusting with a sequential traversal approach, where the target number of adjusting is a K power of 2; if the responsive voltage value is less than the preset voltage value, the to-be-corrected parameter value can be increased based on the sequential traversal approach; and if the responsive voltage value is greater than the preset voltage value, the to-be-corrected parameter value can be reduced based on the sequential traversal approach; or, adjusting with a successive approximation approach, where the target number of adjusting is K; if the responsive voltage value is less than the preset voltage value, the to-be-corrected parameter value can be increased based on the successive approximation approach; and if the responsive voltage value is greater than the preset voltage value, the to-be-corrected parameter value can be reduced based on the successive approximation approach.

For example, increasing the to-be-corrected parameter value based on the sequential traversal approach may include: performing a plus 1 operation on the to-be-corrected parameter value with the sequential traversal approach.

For example, reducing the to-be-corrected parameter value based on the sequential traversal approach may include: performing a minus 1 operation on the to-be-corrected parameter value with the sequential traversal approach.

For example, increasing the to-be-corrected parameter value based on the successive approximation approach may include: determining a target adjustment bit of the to-be-corrected parameter value with the successive approximation approach, and if a value of the target adjustment bit is 0, modifying the value of the target adjustment bit to 1.

For example, reducing the to-be-corrected parameter value based on the successive approximation approach may include: determining a target first adjustment bit and a target second adjustment bit of the to-be-corrected parameter value with the successive approximation approach, where the target first adjustment bit may be a bit immediately before the target second adjustment bit; if a value of the target first adjustment bit is 1 and a value of the target second adjustment bit is 0, the value of the target first adjustment bit can be modified to 0 and the value of the target second adjustment bit can be modified to 1.

The systems, apparatuses, modules or units illustrated in the above embodiments may specifically be realized by a computer chip or an entity, or by a product with a certain function. A typical implementation device is a computer, and a specific form of the computer may be a personal computer, a laptop computer, a cellular telephone, a camera phone, a smart phone, a personal digital assistant, a media player, a navigation device, an e-mail transceiver, a gaming console, a tablet computer, a wearable device, or a combination of any of these devices.

For the convenience of description, when describing the above apparatus, the functions are divided into various units and described separately. Of course, the functions of each unit can be implemented in the same or multiple software and/or hardware when the present disclosure is implemented.

It should be understood by those skilled in the art that embodiments of the present disclosure can be provided as a method, a system, or a computer program product. Therefore, the present disclosure can take the form of an entirely hardware embodiment, an entirely software embodiment, or an embodiment combining software and hardware aspects. Moreover, embodiments of the present disclosure can take the form of a computer program product implemented on one or more computer-usable storage media (including but not limited to disk storage, CD-ROM, optical storage, etc.) containing computer-usable program codes.

The present disclosure is described with reference to flowcharts and/or block diagrams of methods, devices (systems), and computer program products according to the embodiments of the present disclosure. It should be understood that each flow and/or block in the flowcharts and/or block diagrams, and combinations of the flow and/or block in the flowcharts and/or block diagrams can be implemented by computer program instructions. These computer program instructions may be provided to a processor of a general-purpose computer, a special-purpose computer, an embedded processor or other programmable data processing device to produce a machine, such that instructions which are executed by a processor of the computer or other programmable data processing device produce an apparatus for implementing the functions specified in one or more flows of the flowcharts and/or one or more blocks of the block diagrams.

Moreover, these computer program instructions may also be stored in a computer-readable memory that can direct a computer or other programmable data processing device to function in a particular manner, such that the instructions stored in the computer-readable memory produce an article of manufacture including an instruction apparatus that implements the functions specified in one or more flows of the flowcharts and/or one or more blocks of the block diagrams.

These computer program instructions may also be loaded onto a computer or other programmable data processing devices, such that a series of operational steps are performed on the computer or other programmable devices to produce a computer-implemented process, such that the instructions executed on the computer or other programmable devices provides steps for implementing the functions specified in one or more flows of the flowcharts and/or one or more blocks of the block diagrams.

The above is only embodiments of the present disclosure and is not intended to limit the present disclosure. Various modifications and variations of the present disclosure will occur to those skilled in the art. Any modifications, equivalent substitutions, improvements, etc. made within the spirit and principle of the present disclosure should be included in the scope of the claims of the present disclosure.

The invention claimed is:

1. A readout circuit of an infrared focal plane array (FPA), comprising an integral and readout unit of a focal plane, a correction unit and a digital control unit, wherein the integral and readout unit is connected with the infrared FPA which comprises a plurality of pixels, and for each pixel in the infrared FPA:
   the correction unit is configured to determine an initial bias value based on a to-be-corrected parameter value for the pixel, and transfer the initial bias value to the integral and readout unit;
   the integral and readout unit is configured to determine a responsive voltage value for the pixel based on a first current corresponding to the initial bias value and a second current caused by the pixel in response to a temperature value; and
   the digital control unit is configured to obtain an adjusted parameter value by adjusting the to-be-corrected parameter value based on a comparison result of the responsive voltage value and a preset voltage value, determine an optimal correction parameter value for the pixel based on the adjusted parameter value, and replace the to-be-corrected parameter value for the pixel by the optimal correction parameter value for the pixel.

2. The readout circuit according to claim 1, further comprises a storage unit;
   the digital control unit is further configured to acquire the to-be-corrected parameter value for the pixel, write the to-be-corrected parameter value into the storage unit, and the storage unit stores the to-be-corrected parameter value; and
   the correction unit is further configured to acquire the to-be-corrected parameter value for the pixel from the storage unit;
   wherein for the plurality of pixels comprised in the infrared FPA, to-be-corrected parameter values corresponding to different pixels are same, or to-be-corrected parameter values corresponding to different pixels are different.

3. The readout circuit according to claim 1, wherein the correction unit comprises a digital to analog converter (DAC), and the correction unit, when determining the initial bias value based on the to-be-corrected parameter value for the pixel, is configured to:
   obtain an analog voltage signal by the DAC performing a digital-to-analog conversion on the to-be-corrected parameter value of a digital-signal; and
   determine a voltage value corresponding to the analog voltage signal as the initial bias value.

4. The readout circuit according to claim 2, wherein when the to-be-corrected parameter value is a K-bit binary value, the storage unit comprises K data regions,
   the K data regions correspond to K bits of the binary value one by one, wherein K is a positive integer greater than 1; and
   wherein, the storage unit, when storing the to-be-corrected parameter value, is configured to store a m-th bit value of the to-be-corrected parameter value in a m-th data region, and a value range of m is 1 to K.

5. The readout circuit according to claim 1, wherein the integral and readout unit comprises a first metal oxide semiconductor (MOS) transistor and an integration circuit,
   an input voltage of the first MOS transistor is the initial bias value, and a current passing through the first MOS transistor is a first current corresponding to the initial bias value,
   the integration circuit is connected with the first MOS transistor, and the integration circuit is connected with the pixel;
   wherein the integral and readout unit, when determining the responsive voltage value for the pixel based on the first current corresponding to the initial bias value and the second current caused by the pixel in response to the temperature value, is configured to:
   determine a sum of the first current and the second current as an input current of the integration circuit;
   input the input current to the integration circuit, and obtain a voltage input value for the pixel by the integration circuit performing integral operation on the input current; and
   determine the responsive voltage value for the pixel based on the voltage input value for the pixel;

wherein the integral and readout unit further comprises a sample-and-hold circuit, and the sample-and-hold circuit is connected with the integration circuit;

the integral and readout unit, when determining the responsive voltage value for the pixel based on the voltage input value for the pixel, is configured to:

input the voltage input value for the pixel to the sample-and-hold circuit; and obtain the responsive voltage value for the pixel by the sample-and-hold circuit performing sampling on the voltage input value and holding.

6. The readout circuit according to claim 1, wherein the digital control unit, when determining the optimal correction parameter value for the pixel based on the adjusted parameter value, is configured to:

if a number of adjusting the to-be-corrected parameter value has reached a target number of adjusting, take the adjusted parameter value as the optimal correction parameter value for the pixel; or, if the number of adjusting the to-be-corrected parameter value does not reach the target number of adjusting, take the adjusted parameter value as the to-be-corrected parameter value for the pixel.

7. The readout circuit according to claim 6, wherein the digital control unit, when obtaining the adjusted parameter value by adjusting the to-be-corrected parameter value based on the comparison result of the responsive voltage value and the preset voltage value, is configured to:

if the comparison result is that the responsive voltage value is less than the preset voltage value, obtain the adjusted parameter value by increasing the to-be-corrected parameter value; and if the comparison result is that the responsive voltage value is greater than the preset voltage value, obtain the adjusted parameter value by reducing the to-be-corrected parameter value.

8. The readout circuit according to claim 7, wherein, the readout circuit further comprises a comparison logic unit configured to determine a logic value based on the responsive voltage value and the preset voltage value and output the logic value to the digital control unit; wherein, if the responsive voltage value is less than the preset voltage value, the logic value is determined as a first value; or if the responsive voltage value is greater than the preset voltage value, the logic value is determined as a second value; and the digital control unit is further configured to determine the comparison result of the responsive voltage value and the preset voltage value based on the logic value; wherein, if the logic value is of the first value, determine that the comparison result is that the responsive voltage value is less than the preset voltage value; or, if the logic value is of the second value, determine that the comparison result is that the responsive voltage value is greater than the preset voltage value;

wherein the digital control unit is further configured to:

determine a state corresponding to the readout circuit, wherein the readout circuit corresponds to a correction state in a case that the readout circuit is powered on; and the readout circuit corresponds to a readout state when the optimal correction parameter value for the pixel is determined;

wherein the digital control unit is further configured to:

control a shutter to open when the readout circuit corresponds to the correction state, so that respective pixels in the infrared FPA sense a temperature value of the shutter; and control the shutter to close when the readout circuit corresponds to the readout state, so that respective pixels in the infrared FPA sense an actual target temperature value of a target scene.

9. The readout circuit according to claim 7, wherein the digital control unit, when obtaining the adjusted parameter value by adjusting the to-be-corrected parameter value based on the comparison result of the responsive voltage value and the preset voltage value, is configured to:

when the to-be-corrected parameter value is a K-bit binary value, K is a positive integer greater than 1, if perform adjusting with a sequential traversal approach, the target number of adjusting is a K power of 2; if the comparison result is that the responsive voltage value is less than the preset voltage value, obtain the adjusted parameter value by increasing the to-be-corrected parameter value based on the sequential traversal approach; and if the comparison result is that the responsive voltage value is greater than the preset voltage value, obtain the adjusted parameter value by reducing the to-be-corrected parameter value based on the sequential traversal approach;

or, if perform adjusting with a successive approximation approach, the target number of adjusting is K; if the comparison result is that the responsive voltage value is less than the preset voltage value, obtain the adjusted parameter value by increasing the to-be-corrected parameter value based on the successive approximation approach; or if the comparison result is that the responsive voltage value is greater than the preset voltage value, obtain the adjusted parameter value by reducing the to-be-corrected parameter value based on the successive approximation approach.

10. The readout circuit according to claim 9, wherein, obtaining the adjusted parameter value by increasing the to-be-corrected parameter value based on the sequential traversal approach comprises: obtaining the adjusted parameter value by performing a plus 1 operation on the to-be-corrected parameter value with the sequential traversal approach; and obtaining the adjusted parameter value by reducing the to-be-corrected parameter value based on the sequential traversal approach comprises: obtaining the adjusted parameter value by performing a minus 1 operation on the to-be-corrected parameter value with the sequential traversal approach.

11. The readout circuit according to claim 1, further comprises an analog to digital converter (ADC) configured to:

acquire the responsive voltage value from the integral and readout unit;

obtain a responsive voltage value in digital-signal by performing an analog-to-digital conversion on the responsive voltage value; and output the responsive voltage value in digital-signal to the digital control unit, and the digital control unit adjusts the to-be-corrected parameter value based on the comparison result between the responsive voltage value in digital-signal and a preset voltage value in digital-signal.

12. The readout circuit according to claim 8, wherein the digital control unit is further configured to:
   send a first control signal to the comparison logic unit when the readout circuit corresponds to the correction state, so that the comparison logic unit determines that the readout circuit corresponds to the correction state based on the first control signal, determines the logic value based on the responsive voltage value and the preset voltage value when receiving the responsive voltage value, and outputs the logic value to the digital control unit; and
   send a second control signal to the comparison logic unit when the readout circuit corresponds to the readout state, so that the comparison logic unit determines that the readout circuit enters the readout state based on the second control signal, and outputs the responsive voltage value when receiving the responsive voltage value.

13. The readout circuit according to claim 8, wherein when the readout circuit corresponds to the readout state:
   the correction unit is configured to determine a target bias value based on the optimal correction parameter value for the pixel, and transfer the target bias value to the integral and readout unit;
   the integral and readout unit is configured to determine the responsive voltage value for the pixel based on a third current corresponding to the target bias value and a fourth current caused by the pixel in response to the temperature value; and
   the comparison logic unit is configured to output the responsive voltage value after receiving the responsive voltage value for the pixel.

14. A control method based on the readout circuit of the infrared focal plane array (FPA) according to claim 1, the readout circuit being connected with the infrared FPA comprising a plurality of pixels, and the method comprising:
   in response to that the readout circuit is powered on, controlling, by the readout circuit, a shutter to open, so that respective pixels in the infrared FPA sense a temperature value of the shutter;
   during the respective pixels in the infrared FPA sense the temperature value of the shutter is sensed, determining, by the readout circuit, an optimal correction parameter value for each of the respective pixels in the infrared FPA;
   in response to that the optimal correction parameter value for each of the respective pixels is determined, controlling, by the readout circuit, the shutter to close, so that the respective pixels in the infrared FPA sense an actual target temperature value of a target scene; and
   when the respective pixels in the infrared FPA sense the actual target temperature value, determining, by the readout circuit, a responsive voltage value for each of the respective pixels based on the optimal correction parameter value for the pixel, and outputting the responsive voltage value for each of the respective pixels in the infrared FPA.

15. The method according to claim 14, wherein determining, by the readout circuit, an optimal correction parameter value for each of the respective pixels in the infrared FPA comprises:
   for each of the respective pixels, determining an initial bias value based on a to-be-corrected parameter value for the pixel;
   determining a responsive voltage value for the pixel based on a first current corresponding to the initial bias value and a second current caused by the pixel in response to a temperature value; and
   obtaining an adjusted parameter value by adjusting the to-be-corrected parameter value based on a comparison result of the responsive voltage value and a preset voltage value; and
   determining an optimal correction parameter value for the pixel based on the adjusted parameter value;
   wherein the to-be-corrected parameter value and the preset voltage value are preconfigured;
   for the plurality of pixels comprised in the infrared FPA, to-be-corrected parameter values for different pixels are same or different, and preset voltage values for the different pixels are same.

16. The method according to claim 15, wherein,
   obtaining an adjusted parameter value by adjusting the to-be-corrected parameter value based on a comparison result of the responsive voltage value and a preset voltage value comprises:
      if the comparison result is that the responsive voltage value is less than the preset voltage value, obtaining the adjusted parameter value by increasing the to-be-corrected parameter value; or
      if the comparison result is that the responsive voltage value is greater than the preset voltage value, obtaining the adjusted parameter value by reducing the to-be-corrected parameter value;
   determining an optimal correction parameter value for the pixel based on the adjusted parameter value comprises:
      if a number of adjusting the to-be-corrected parameter value has reached a target number of adjusting, taking the adjusted parameter value as the optimal correction parameter value for the pixel; or,
      if the number of adjusting the to-be-corrected parameter value does not reach the target number of adjusting, taking the adjusted parameter value as the to-be-corrected parameter value for the pixel, and returning to adjusting the to-be-corrected parameter value based on the comparison result of the responsive voltage value and the preset voltage value.

17. The method according to claim 16, wherein, adjusting the to-be-corrected parameter value based on a comparison result of the responsive voltage value and a preset voltage value comprises:
   when the to-be-corrected parameter value is a K-bit binary value, K is a positive integer greater than 1:
   if adjusting with a sequential traversal approach, the target number of adjusting is a K power of 2; if the comparison result is that the responsive voltage value is less than the preset voltage value, obtaining the adjusted parameter value by increasing the to-be-corrected parameter value based on the sequential traversal approach; and if the comparison result is that the responsive voltage value is greater than the preset voltage value, obtaining the adjusted parameter value by reducing the to-be-corrected parameter value based on the sequential traversal approach;
   or, if adjusting with a successive approximation approach, the target number of adjusting is K; if the comparison result is that the responsive voltage value is less than the preset voltage value, obtaining the adjusted parameter value by increasing the to-be-corrected parameter value based on the successive approximation approach; and if the comparison result is that the responsive voltage value is greater than the preset voltage value, obtaining the adjusted parameter value by reducing the to-be-corrected parameter value based on the successive approximation approach.

18. The method according to claim 17, wherein, obtaining the adjusted parameter value by increasing the to-be-corrected parameter value based on the sequential traversal approach comprises: obtaining the adjusted parameter value by performing a plus 1 operation on the to-be-corrected parameter value with the sequential traversal approach; and obtaining the adjusted parameter value by reducing the to-be-corrected parameter value based on the sequential traversal approach comprises: obtaining the adjusted parameter value by performing a minus 1 operation on the to-be-corrected parameter value with the sequential traversal approach.

19. The readout circuit according to claim 9 wherein, obtaining the adjusted parameter value by increasing the to-be-corrected parameter value based on the successive approximation approach comprises: determining a target adjustment bit of the to-be-corrected parameter value with the successive approximation approach, and if a value of the target adjustment bit is 0, obtaining the adjusted parameter value by modifying the value of the target adjustment bit to 1; and obtaining the adjusted parameter value by reducing the to-be-corrected parameter value based on the successive approximation approach comprises: determining a target first adjustment bit and a target second adjustment bit of the to-be-corrected parameter value with the successive approximation approach, wherein the target first adjustment bit is a bit immediately before the target second adjustment bit; if a value of the target first adjustment bit is 1 and a value of the target second adjustment bit is 0, obtaining the adjusted parameter value by modifying the value of the target first adjustment bit to 0 and modifying the value of the target second adjustment bit to 1.

20. The method according to claim 17, wherein, obtaining the adjusted parameter value by increasing the to-be-corrected parameter value based on the successive approximation approach comprises: determining a target adjustment bit of the to-be-corrected parameter value with the successive approximation approach, and if a value of the target adjustment bit is 0, obtaining the adjusted parameter value by modifying the value of the target adjustment bit to 1; and obtaining the adjusted parameter value by reducing the to-be-corrected parameter value based on the successive approximation approach comprises: determining a target first adjustment bit and a target second adjustment bit of the to-be-corrected parameter value with the successive approximation approach, wherein the target first adjustment bit is a bit immediately before the target second adjustment bit; if a value of the target first adjustment bit is 1 and a value of the target second adjustment bit is 0, obtaining the adjusted parameter value by modifying the value of the target first adjustment bit to 0 and modifying the value of the target second adjustment bit to 1.

\* \* \* \* \*